United States Patent
Noble et al.

(10) Patent No.: US 7,223,678 B2
(45) Date of Patent: May 29, 2007

(54) CIRCUIT AND METHOD FOR A FOLDED BIT LINE MEMORY CELL WITH VERTICAL TRANSISTOR AND TRENCH CAPACITOR

(75) Inventors: Wendell P. Noble, Milton, VT (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/214,557

(22) Filed: Aug. 30, 2005

(65) Prior Publication Data

US 2006/0003525 A1  Jan. 5, 2006

Related U.S. Application Data

(60) Division of application No. 10/879,378, filed on Jun. 29, 2004, now Pat. No. 7,057,223, which is a continuation of application No. 09/551,027, filed on Apr. 17, 2000, now Pat. No. 6,764,901, which is a division of application No. 08/939,742, filed on Oct. 6, 1997, now Pat. No. 6,066,869.

(51) Int. Cl.
*H01L 21/8238* (2006.01)

(52) U.S. Cl. .................. 438/587; 438/209; 438/210; 438/243

(58) Field of Classification Search ........... 438/587, 438/243, 241, 209, 210
See application file for complete search history.

(56) References Cited

U.S. PATENT DOCUMENTS 3,657,575 A  4/1972  Taniguchi et al.
3,806,741 A  4/1974  Smith (Continued)

FOREIGN PATENT DOCUMENTS

| EP | 0198590 | 10/1986 |
|---|---|---|
| JP | 61-140170 | 6/1986 |
| JP | 63-066963 | 3/1988 |
| JP | 5226661 | 9/1993 |
| JP | 11-135757 | 5/1999 |
| JP | 2000-164883 | 6/2000 |

OTHER PUBLICATIONS

Adler, E., et al., "The Evolution of IBM CMOS DRAM Technology", *IBM Journal of Research & Development*, 39(1-2), (Jan.-Mar. 1995), 167-188.

(Continued)

*Primary Examiner*—Michael Trinh
(74) *Attorney, Agent, or Firm*—Schwegman, Lundberg, Woessner & Kluth, P.A.

(57) ABSTRACT

A memory cell for a memory array in a folded bit line configuration. The memory cell includes an access transistor formed in a pillar of single crystal semiconductor material. The access transistor has first and second source/drain regions and a body region that are vertically aligned. The access transistor further includes a gate coupled to a wordline disposed adjacent to the body region. The memory cell also includes a passing wordline that is separated from the gate by an insulator for coupling to other memory cells adjacent to the memory cell. The memory cell also includes a trench capacitor. The trench capacitor includes a first plate that is formed integral with the first source/drain region of the access transistor. The trench capacitor also includes a second plate that is disposed adjacent to the first plate and separated from the first plate by a gate oxide.

35 Claims, 16 Drawing Sheets

U.S. PATENT DOCUMENTS

| | | |
|---|---|---|
| 3,931,617 A | 1/1976 | Russell |
| 4,020,364 A | 4/1977 | Kuijk |
| 4,051,354 A | 9/1977 | Choate |
| 4,252,579 A | 2/1981 | Ho et al. |
| 4,313,106 A | 1/1982 | Hsu |
| 4,570,176 A | 2/1986 | Kolwicz |
| 4,604,162 A | 8/1986 | Sobczak |
| 4,617,649 A | 10/1986 | Kyomasu et al. |
| 4,630,088 A | 12/1986 | Ogura et al. |
| 4,663,831 A | 5/1987 | Birrittella et al. |
| 4,673,962 A | 6/1987 | Chatterjee et al. |
| 4,677,589 A | 6/1987 | Haskell et al. |
| 4,701,423 A | 10/1987 | Szluk |
| 4,716,314 A | 12/1987 | Mulder et al. |
| 4,740,826 A | 4/1988 | Chatterjee |
| 4,761,385 A | 8/1988 | Pfiester |
| 4,761,768 A | 8/1988 | Turner et al. |
| 4,766,569 A | 8/1988 | Turner et al. |
| 4,845,537 A | 7/1989 | Nishimura et al. |
| 4,888,735 A | 12/1989 | Lee et al. |
| 4,906,590 A | 3/1990 | Kanetaki et al. |
| 4,920,065 A | 4/1990 | Chin et al. |
| 4,920,389 A | 4/1990 | Itoh |
| 4,920,515 A | 4/1990 | Obata |
| 4,929,988 A | 5/1990 | Yoshikawa |
| 4,949,138 A | 8/1990 | Nishimura |
| 4,958,318 A | 9/1990 | Harari |
| 4,965,651 A | 10/1990 | Wagner |
| 4,987,089 A | 1/1991 | Roberts |
| 5,001,526 A | 3/1991 | Gotou |
| 5,006,909 A | 4/1991 | Kosa |
| 5,010,386 A | 4/1991 | Groover, III |
| 5,017,504 A | 5/1991 | Nishimura et al. |
| 5,021,355 A | 6/1991 | Dhong et al. |
| 5,028,977 A | 7/1991 | Kenneth et al. |
| 5,057,896 A | 10/1991 | Gotou |
| 5,072,269 A | 12/1991 | Hieda |
| 5,083,047 A | 1/1992 | Horie et al. |
| 5,087,581 A | 2/1992 | Rodder |
| 5,102,817 A | 4/1992 | Chatterjee et al. |
| 5,107,459 A | 4/1992 | Chu et al. |
| 5,110,752 A | 5/1992 | Lu |
| 5,128,831 A | 7/1992 | Fox, III et al. |
| 5,140,388 A | 8/1992 | Bartelink |
| 5,156,987 A | 10/1992 | Sandhu et al. |
| 5,177,028 A | 1/1993 | Manning |
| 5,177,576 A | 1/1993 | Kimura et al. |
| 5,181,089 A | 1/1993 | Matsuo et al. |
| 5,191,509 A | 3/1993 | Wen |
| 5,202,278 A | 4/1993 | Mathews et al. |
| 5,208,657 A | 5/1993 | Chatterjee et al. |
| 5,216,266 A | 6/1993 | Ozaki |
| 5,220,530 A | 6/1993 | Itoh |
| 5,221,867 A | 6/1993 | Mitra et al. |
| 5,223,081 A | 6/1993 | Doan |
| 5,266,514 A | 11/1993 | Tuan et al. |
| 5,276,343 A | 1/1994 | Kumagai et al. |
| 5,292,676 A | 3/1994 | Manning |
| 5,308,782 A | 5/1994 | Mazure et al. |
| 5,316,962 A | 5/1994 | Matsuo et al. |
| 5,320,880 A | 6/1994 | Sandhu et al. |
| 5,327,380 A | 7/1994 | Kersh, III et al. |
| 5,329,481 A | 7/1994 | Seevinck et al. |
| 5,341,331 A | 8/1994 | Jeon |
| 5,363,325 A | 11/1994 | Sunouchi et al. |
| 5,365,477 A | 11/1994 | Cooper, Jr. et al. |
| 5,376,575 A | 12/1994 | Kim et al. |
| 5,378,914 A | 1/1995 | Ohzu et al. |
| 5,379,255 A | 1/1995 | Shah |
| 5,382,540 A | 1/1995 | Sharma et al. |
| 5,385,853 A | 1/1995 | Mohammad |
| 5,385,854 A | 1/1995 | Batra et al. |
| 5,391,911 A | 2/1995 | Beyer et al. |
| 5,392,245 A | 2/1995 | Manning |
| 5,393,704 A | 2/1995 | Huang et al. |
| 5,396,093 A | 3/1995 | Lu |
| 5,396,452 A | 3/1995 | Wahlstrom |
| 5,409,563 A | 4/1995 | Cathey |
| 5,410,169 A | 4/1995 | Yamamoto et al. |
| 5,414,287 A | 5/1995 | Hong |
| 5,414,288 A | 5/1995 | Fitch et al. |
| 5,416,350 A | 5/1995 | Watanabe |
| 5,416,736 A | 5/1995 | Kosa et al. |
| 5,422,296 A | 6/1995 | Lage |
| 5,422,499 A | 6/1995 | Manning |
| 5,427,972 A | 6/1995 | Shimizu et al. |
| 5,429,955 A | 7/1995 | Joyner et al. |
| 5,432,739 A | 7/1995 | Pein |
| 5,438,009 A | 8/1995 | Yang et al. |
| 5,440,158 A | 8/1995 | Sung-Mu |
| 5,443,992 A | 8/1995 | Risch et al. |
| 5,445,986 A | 8/1995 | Hirota |
| 5,451,538 A | 9/1995 | Fitch et al. |
| 5,451,889 A | 9/1995 | Heim et al. |
| 5,460,316 A | 10/1995 | Hefele |
| 5,460,988 A | 10/1995 | Hong |
| 5,466,625 A | 11/1995 | Hsieh et al. |
| 5,483,094 A | 1/1996 | Sharma et al. |
| 5,483,487 A | 1/1996 | Sung-Mu |
| 5,492,853 A | 2/1996 | Jeng et al. |
| 5,495,441 A | 2/1996 | Hong |
| 5,497,017 A | 3/1996 | Gonzales |
| 5,502,629 A | 3/1996 | Ito et al. |
| 5,504,357 A | 4/1996 | Kim et al. |
| 5,508,219 A | 4/1996 | Bronner et al. |
| 5,508,542 A | 4/1996 | Geiss et al. |
| 5,519,236 A | 5/1996 | Ozaki |
| 5,528,062 A | 6/1996 | Hsieh et al. |
| 5,528,173 A | 6/1996 | Merritt et al. |
| 5,563,083 A | 10/1996 | Pein |
| 5,574,299 A | 11/1996 | Kim |
| 5,576,238 A | 11/1996 | Fu |
| 5,581,101 A | 12/1996 | Ning et al. |
| 5,593,912 A | 1/1997 | Rajeevakumar |
| 5,612,559 A | 3/1997 | Park et al. |
| 5,616,934 A | 4/1997 | Dennison et al. |
| 5,627,097 A | 5/1997 | Venkatesan et al. |
| 5,627,390 A | 5/1997 | Maeda et al. |
| 5,637,898 A | 6/1997 | Baliga |
| 5,640,342 A | 6/1997 | Gonzalez |
| 5,640,350 A | 6/1997 | Iga |
| 5,641,545 A | 6/1997 | Sandhu |
| 5,644,540 A | 7/1997 | Manning |
| 5,646,900 A | 7/1997 | Tsukude et al. |
| 5,674,769 A | 10/1997 | Alsmeier et al. |
| 5,691,230 A | 11/1997 | Forbes |
| 5,696,011 A | 12/1997 | Yamazaki et al. |
| 5,705,415 A | 1/1998 | Orlowski et al. |
| 5,707,885 A | 1/1998 | Lim |
| 5,714,793 A | 2/1998 | Cartagena et al. |
| 5,719,409 A | 2/1998 | Singh et al. |
| 5,731,609 A | 3/1998 | Hamamoto et al. |
| 5,753,947 A | 5/1998 | Gonzalez |
| 5,760,434 A | 6/1998 | Zahurak et al. |
| 5,780,888 A | 7/1998 | Maeda et al. |
| 5,789,967 A | 8/1998 | Katoh |
| 5,801,413 A | 9/1998 | Pan |
| 5,818,084 A | 10/1998 | Williams et al. |
| 5,821,578 A | 10/1998 | Shimoji |
| 5,821,796 A | 10/1998 | Yaklin et al. |
| 5,827,765 A | 10/1998 | Stengl et al. |
| 5,834,814 A | 11/1998 | Ito |
| 5,852,375 A | 12/1998 | Byrne et al. |
| 5,864,158 A | 1/1999 | Liu et al. |

| | | |
|---|---|---|
| 5,874,760 A | 2/1999 | Burns, Jr. et al. |
| 5,877,061 A | 3/1999 | Halle et al. |
| 5,879,971 A | 3/1999 | Witek |
| 5,907,170 A | 5/1999 | Forbes et al. |
| 5,909,400 A | 6/1999 | Bertin et al. |
| 5,909,618 A | 6/1999 | Forbes et al. |
| 5,914,511 A | 6/1999 | Noble et al. |
| 5,917,342 A | 6/1999 | Okamura |
| 5,920,088 A | 7/1999 | Augusto |
| 5,926,412 A | 7/1999 | Evans, Jr. et al. |
| 5,933,717 A | 8/1999 | Hause et al. |
| 5,936,274 A | 8/1999 | Forbes et al. |
| 5,943,267 A | 8/1999 | Sekariapuram et al. |
| 5,946,472 A | 8/1999 | Graves et al. |
| 5,963,469 A | 10/1999 | Forbes |
| 5,973,352 A | 10/1999 | Noble |
| 5,973,356 A | 10/1999 | Noble et al. |
| 5,981,995 A | 11/1999 | Selcuk |
| 5,990,509 A | 11/1999 | Burns, Jr. et al. |
| 5,991,225 A | 11/1999 | Forbes et al. |
| 5,998,820 A | 12/1999 | Chi |
| 6,006,166 A | 12/1999 | Meyer |
| 6,016,268 A | 1/2000 | Worley |
| 6,025,225 A | 2/2000 | Forbes et al. |
| 6,040,210 A | 3/2000 | Burns, Jr. et al. |
| 6,040,218 A | 3/2000 | Lam |
| 6,043,527 A | 3/2000 | Forbes |
| 6,066,869 A | 5/2000 | Noble et al. |
| 6,072,209 A | 6/2000 | Noble et al. |
| 6,100,123 A | 8/2000 | Bracchitta et al. |
| 6,121,084 A | 9/2000 | Coursey |
| 6,134,175 A | 10/2000 | Forbes et al. |
| 6,143,636 A | 11/2000 | Forbes et al. |
| 6,150,687 A | 11/2000 | Noble et al. |
| 6,153,468 A | 11/2000 | Forbes et al. |
| 6,156,604 A | 12/2000 | Forbes et al. |
| 6,156,607 A | 12/2000 | Noble et al. |
| 6,165,836 A | 12/2000 | Forbes et al. |
| 6,172,391 B1 | 1/2001 | Goebel et al. |
| 6,172,535 B1 | 1/2001 | Hopkins |
| 6,181,121 B1 | 1/2001 | Kirkland et al. |
| 6,181,196 B1 | 1/2001 | Nguyen |
| 6,208,164 B1 | 3/2001 | Noble et al. |
| 6,221,788 B1 | 4/2001 | Kobayashi et al. |
| 6,238,976 B1 | 5/2001 | Noble et al. |
| 6,242,775 B1 | 6/2001 | Noble |
| 6,255,708 B1 | 7/2001 | Sudharsanan et al. |
| 6,323,719 B1 | 11/2001 | Chang et al. |
| 6,433,382 B1 | 8/2002 | Orlowski et al. |
| 6,498,065 B1 | 12/2002 | Forbes et al. |
| 6,528,837 B2 | 3/2003 | Forbes et al. |
| 6,812,516 B2 | 11/2004 | Noble, Jr. et al. |
| 7,049,196 B2 | 5/2006 | Noble |
| 7,057,223 B2 * | 6/2006 | Noble et al. ............... 257/296 |
| 7,084,451 B2 | 8/2006 | Forbes et al. |
| 2004/0235243 A1 | 11/2004 | Noble et al. |

OTHER PUBLICATIONS

ASAI, S., "Technology Challenges for Integration Near and Below 0.1 micrometer", *Proceedings of the IEEE*, 85(4), Special Issue on Nanometer-Scale Science & Technology,(Apr. 1997),505-520.

Askin, H. O., et al., "Fet Device Parameters Compensation Circuit", *IBM Technical Disclosure Bulletin*, 14, (Dec. 1971),2088-2089.

Banerjee, S. K., et al., "Characterization of Trench Transistors for 3-D Memories", *1986 Symposium on VLSI Technology, Digest of Technical Papers*, San Diego, CA,(May 1986),79-80.

Blalock, T. N., et al., "A High-Speed Sensing Scheme for 1T Dynamic RAM's Utilizing the Clamped Bit-Line Sense Amplifier", *IEEE Journal of Solid-State Circuits*, 27(4), (Apr. 1992),pp. 618-624.

Bomchil, G., "Porous Silicon: The Material and its Applications in Silicon-On-Insulator Technologies", *Applied Surface Science*, 41/42, (1989),604-613.

Burnett, D., "Implications of Fundamental Threshold Voltage Variations for High-Density SRAM and Logic Circuits", *1994 Symposium on VLSI Technology, Digest of Technical Papers*, Honolulu, HI,(Jun. 1994), 15-16.

Burnett, D., "Statistical Threshold-Voltage Variation and its Impact on Supply-Voltage Scaling", *Proceedings SPIE: Microelectronic Device and Multilevel Interconnection Technology*, 2636, (1995),83-90.

Chen, M., et al., "Back-Gate Forward Bias Method for Low Voltage CMOS Digital Cicuits", *IEEE Transactions on Electron Devices*, 43, (1996),904-909.

Chen, M. J., et al., "Optimizing the Match in Weakly Inverted MOSFET's by Gated Lateral Bipolar Action", *IEEE Transactions on Electron Devices*, 43, (May 1996),766-773.

Chung, I. Y., et al., "A New SOI Inverter for Low Power Applications", *Proceedings of the 1996 IEEE International SOI Conference*, Sanibel Island, FL,(1996),20-21.

Clemen, R., et al., "VT-compensated TTL-Compatible Mos Amplifier", *IBM Technical Disclosure Bulletin*, 21, (1978),2874-2875.

DE, V. K., "Random MOSFET Parameter Fluctuation Limits to Gigascale Integration (GSI)", *1996 Symposium on VLSI Technology, Digest of Technical Papers*, Honolulu, HI,(Jun. 11-13, 1996),198-199.

Debar, D. E., "Dynamic Substrate Bias to Achieve Radiation Hardening", *IBM Technical Disclosure Bulletin*, 25, (1983),5829-5830.

Denton, J. P., et al., "Fully Depleted Dual-Gated Thin-Film SOI P-MOSFET's Fabricated in SOI Islands with an Isolated Buried Polysilicon Backgate", *IEEE Electron Device Letters*, 17(11), (Nov. 1996),pp. 509-511.

Fong, Y., "Oxides Grown on Textured Single-Crystal Silicon—Dependence on Process and Application in EEPROMs", *IEEE Transactions on Electron Devices*, 37(3), (Mar. 1990),pp. 583-590.

Forbes, L., "Automatic On-clip Threshold Voltage Compensation", *IBM Technical Disclosure Bulletin*, 14, (1972),2894-2895.

Forbes, L., et al., "Resonant Forward-Biased Guard-Ring Diodes for Suppression of Substrate Noise in Mixed-Mode CMOS Circuits", *Electronics Letters*, 31, (Apr. 1995),720-721.

Foster, R., et al., "High Rate Low-Temperature Selective Tungsten", *In: Tungsten and Other Refractory Metals for VLSI Applications III*, V.A. Wells, ed., Materials Res. Soc., Pittsburgh, PA,(1988),69-72.

Frantz, H., et al., "Mosfet Substrate Bias-Voltage Generator", *IBM Technical Disclosure Bulletin*, 11, (Mar. 1969),1219-1220.

Fuse, Tsuneaki, et al., "A 0.5v 200MHz 1-Stage 32b ALU Using a Body Bias Controlled SOI Pass-Gate Logic", *1997 IEEE International Solid-State Circuits Conference, Digest of Technical Papers*, (1997),286-287.

Gong, S., "Techniques for reducing switching noise in high speed digital systems", *Proceedings Eighth Annual IEEE International ASIC Conference and Exhibit*, (1995),21-24.

HAO, M. Y., "Electrical Characteristics of Oxynitrides Grown on Textured Single-Crystal Silicon", *Appl. Phys. Lett.*, 60, (Jan. 1992),445-447.

Harada, M., "Suppression of Threshold Voltage Variation in MTCMOS/SIMOX Circuit Operating Below 0.5 V", *1996 Symposium on VLSI Technology, Digest of Technical Papers*, Honolulu, HI,(Jun. 11-13, 1996),96-97.

Heavens, O., *Optical Properties of Thin Solid Films*, Dover Pubs. Inc., New York,(1965),155-206.

Hisamoto, D., et al., "A New Stacked Cell Structure for Giga-Bit DRAMs using Vertical Ultra-Thin SOI (DELTA) MOSFETs", *1991 IEEE International Electron Devices Meeting, Technical Digest*, Washington, D.C.,(Dec. 8-11, 1991),959-961.

Hodges, David A., et al., "MOS Decoders", *In: Analysis and Design of Digital Integrated Circuits*, 2nd Edition, Section: 9.1.3,(1988),354-357.

Holman, W. T., et al., "A Compact Low Noise Operational Amplifier for a 1.2 Micrometer Digital CMOS Technology", *IEEE Journal of Solid-State Circuits*, 30, (Jun. 1995),710-714.

Horie, Hiroshi, et al., "Novel High Aspect Ratio Aluminum Plug for Logic/DRAM LSI's Using Polysilicon-Aluminum Substitute", *Technical Digest: IEEE International Electron Devices Meeting*, San Francisco, CA,(1996),946-948.

Hu, G. , "Will Flash Memory Replace Hard Disk Drive?", *1994 IEEE International Electron Device Meeting*, Panel Discussion, Session 24, Outline,(Dec. 1994),2 pages.

Huang, W. L., et al., "TFSOI Complementary BiCMOS Technology for Low Power Applications", *IEEE Transactions on Electron Devices*, 42, (Mar. 1995),506-512.

Jun, Y. K., "The Fabrication and Electrical Properties of Modulated Stacked Capacitor for Advanced DRAM Applications", *IEEE Electron Device Letters*, 13, (Aug. 1992),430-432.

Jung, T. S., "A 117-mm2 3.3-V Only 128-Mb Multilevel NAND Flash Memory for Mass Storage Applications", *IEEE Journal of Solid-State Circuits*, 31, (Nov. 1996),1575-1583.

Kang, H. K., et al., "Highly Manufacturable Process Technology for Reliable 256 Mbit and 1Gbit DRAMs", *IEEE International Electron Devices Meeting, Technical Digest*, San Francisco, CA,(Dec. 11-14, 1994),635-638.

Kim, Y. S., "A Study on Pyrolysis DMEAA for Selective Deposition of Aluminum", *In: Advanced Metallization and Interconnect Systems for ULSI Applications in 1995*, R.C. Ellwanger, et al., (eds.), Materials Research Society, Pittsburgh, PA,(1996),675-680.

Kishimoto, T. , et al., "Well Structure by High-Energy Boron Implantation for Soft-Error Reduction in Dynamic Random Access Memories (DRAMs)", *Japanese Journal of Applied Physics*, 34, (Dec. 1995),6899-6902.

Klaus, J W., et al., "Atomic Layer Controlled Growth of SiO2 Films Using Binary Reaction Sequence Chemistry", *Applied Physics Letters*, 70(9), (Mar. 3, 1997),1092-94.

Kohyama, Y. , et al., "Buried Bit-Line Cell for 64MB DRAMs", *1990 Symposium on VLSI Technology, Digest of Technical Papers*, Honolulu, HI,(Jun. 4-7, 1990),17-18.

Koshida, N. , "Efficient Visible Photoluminescence from Porous Silicon", *Japanese Journal of Applied Physics*, 30, (Jul. 1991),L1221-L1223.

Kuge, Shigehiro , et al., "SOI-DRAM Circuit Technologies for Low Power High Speed Multigiga Scale Memories", *IEEE Journal of Solid-State Circuits*, 31(4), (Apr. 1996),pp. 586-591.

Lantz, II, L. , "Soft Errors Induced By Alpha Particles", *IEEE Transactions on Reliability*, 45, (Jun. 1996),174-179.

Lehmann, et al., "A Novel Capacitor Technology Based on Porous Silicon", *Thin Solid Films 276, Elsevier Science*, (1996),138-42.

Lehmann, V. , "The Physics of Macropore Formation in Low Doped n-Type Silicon", *Journal of the Electrochemical Society*, 140(10), (Oct. 1993),2836-2843.

Lu, N. , et al., "The SPT Cell—A New Substrate-Plate Trench Cell for DRAMs", *1985 IEEE International Electron Devices Meeting, Technical Digest*, Washington, D.C.,(Dec. 1-4, 1985),771-772.

Macsweeney, D. , et al., "Modelling of Lateral Bipolar Devices in a CMOS Process", *IEEE Bipolar Circuits and Technology Meeting*, Minneapolis, MN,(Sep. 1996),27-30.

Maeda, S. , et al., "A Vertical Phi-Shape Transistor (VPhiT) Cell for 1 Gbit DRAM and Beyond", *1994 Symposium of VLSI Technology, Digest of Technical Papers*, Honolulu, HI,(Jun. 7-9, 1994),133-134.

Maeda, S. , et al., "Impact of a Vertical Phi-Shape Transistor (VPhiT) Cell for 1 Gbit DRAM and Beyond", *IEEE Transactions on Electron Devices*, 42, (Dec. 1995),2117-2123.

Malaviya, S. , *IBM TBD*, 15, (Jul. 1972),p. 42.

Masu, K. , et al., "Multilevel Metallization Based on Al CVD", *1996 IEEE Symposium on VLSI Technology, Digest of Technical Papers*, Honolulu, HI,(Jun. 11-13, 1996),44-45.

McCredie, B. D., et al., "Modeling, Measurement, and Simulation of Simultaneous Switching Noise", *IEEE Transactions on Components, Packaging, and Manufacturing Technology—Part B*, 19, (Aug. 1996),461-472.

Muller, K. , et al., "Trench Storage Node Technology for Gigabit DRAM Generations", *Digest IEEE International Electron Devices Meeting*, San Francisco, CA,(Dec. 1996),507-510.

Nitayama, A. , et al., "High Speed and Compact CMOS Circuits with Multipillar Surrounding Gate Transistors", *IEEE Transactions on Electron Devices*, 36, (Nov. 1989),2605-2606.

Ohba, T. , et al., "Evaluation on Selective Deposition of CVD W Films by Measurement of Surface Temperature", *In: Tungsten and Other Refractory Metals for VLSI Applications II*, Materials Research Society, Pittsburgh, PA,(1987),59-66.

Ohba, T. , et al., "Selective Chemical Vapor Deposition of Tungsten Using Silane and Polysilane Reductions", *In: Tungsten and Other Refractory Metals for VLSI Applications IV*, Materials Research Society, Pittsburgh, PA,(1989),17-25.

Ohno, Y. , et al., "Estimation of the Charge Collection for the Soft-Error Immunity by the 3D-Device Simulation and the Quantitative Investigation", *Simulation of Semiconductor Devices and Processes*, 6, (Sep. 1995),302-305.

Oowaki, Y. , et al., "New alpha-Particle Induced Soft Error Mechanism in a Three Dimensional Capacitor Cell", *IEICE Transactions on Electronics*, 78-C, (Jul. 1995),845-851.

Oshida, S. , et al., "Minority Carrier Collection in 256 M-bit DRAM Cell on Incidence of Alpha-Particle Analyzed by Three-Dimensional Device Simulation", *IEICE Transactions on Electronics*, 76-C, (Nov. 1993),1604-1610.

Ott, A W., et al., "Al303 Thin Film Growth on Si(100) Using Binary Reaction Sequence Chemistry", *Thin Solid Films*, vol. 292, (1997),135-44.

Ozaki, T. , et al., "A Surrounding Isolation-Merged Plate Electrode (SIMPLE) Cell with Checkered Layout for 256Mbit DRAMs and Beyond", *1991 IEEE International Electron Devices Meeting*, Washington, D.C.,(Dec. 8-11, 1991),469-472.

Parke, S. A., et al., "A High-Performance Lateral Bipolar Transistor Fabricated on SIMOX", *IEEE Electron Device Letters*, 14, (Jan. 1993),33-35.

Pein, H. , "A 3-D Sidewall Flash EPROM Cell and Memory Array", *IEEE Transactions on Electron Devices*, 40, (Nov. 1993),2126-2127.

Pein, H. , "Performance of the 3-D PENCIL Flash EPROM Cell and Memory Array", *IEEE Transactions on Electron Devices*, 42, (Nov. 1995),1982-1991.

Pein, H. B., "Performance of the 3-D Sidewall Flash EPROM Cell", *IEEE International Electron Devices Meeting, Technical Digest*, (1993),11-14.

Puri, Y. , "Substrate Voltage Bounce in NMOS Self-biased Substrates", *IEEE Journal of Solid-State Circuits, SC-13*, (Aug. 1978),515-519.

Ramo, S. , " Fields and Waves in Communication Electronics, Third Edition", John Wiley & Sons, Inc.,(1994),428-433.

Rao, K. V., et al., "Trench Capacitor Design Issues in VLSI DRAM Cells", *1986 IEEE International Electron Devices Meeting, Technical Digest*, Los Angeles, CA,(Dec. 7-10, 1986),140-143.

Rhyne, *In: Fundamentals of Digital Systems Design*, Prentice Hall, New Jersey,(1973),pg. 70-71.

Richardson, W. F., et al., "A Trench Transistor Cross-Point DRAM Cell", *IEEE International Electron Devices Meeting*, Washington, D.C.,(Dec. 1-4, 1985),714-717.

Sagara, K. , "A 0.72 micro-meter2 Recessed STC (RSTC) Technology for 256Mbit DRAMs using Quarter-Micron Phase-Shift Lithography", *1992 Symposium on VLSI Technology, Digest of Technical Papers*, Seattle, WA,(Jun. 2-4, 1992),10-11.

Saito, M. , "Technique for Controlling Effective Vth in Multi-Gbit DRAM Sense Amplifier", *1996 Symposium in VLSI Circuits, Digest of Techical Papers*, Honolulu, HI,(Jun. 13-15, 1996),106-107.

Seevinck, E. , et al., "Current-Mode Techniques for High-Speed VLSI Circuits with Application to Current Sense Amplifier for CMOS SRAM's", *IEEE Journal of Solid State Circuits*, 26(4), (Apr. 1991),pp. 525-536.

Senthinathan, R. , et al., "Reference Plane Parasitics Modeling and Their Contribution to the Power and Ground Path "Effective" Inductance as Seen by the Output Drivers", *IEEE Transactions on Microwave Theory and Techniques*, 42, (Sep. 1994),1765-1773.

Shah, A. H., et al., "A 4-Mbit DRAM with Trench-Transistor Cell", *IEEE Journal of Solid-State Circuits, SC-21*, (Oct. 1986),618-625.

Shah, A. H., et al., "A 4Mb DRAM with Cross-Point Trench Transistor Cell", *1986 IEEE International Solid-State Circuits Conference, Digest of Technical Papers*, (Feb. 21, 1986),268-269.

Sherony, M. J., "Reduction of Threshold Voltage Sensitivity in SOI MOSFET's", *IEEE Electron Device Letters*, 16, (Mar. 1995),100-102.

Shimomura, K., "A 1V 46ns 16Mb SOI-DRAM with Body Control Technique", *1997 IEEE International Solid-State Circuits Conference, Digest of Technical Papers*, (Feb. 6, 1997),68-69.

Stanisic, B. R., et al., "Addressing Noise Decoupling in Mixed-Signal IC's: Power Distribution Design and Cell Customization", *IEEE Journal of Solid-State Circuits*, 30, (Mar. 1995),321-326.

Stellwag, T. B., "A Vertically-Integrated GaAs Bipolar DRAM Cell", *IEEE Transactions on Electron Devices*, 38, (Dec. 1991),2704-2705.

Su, D. K., et al., "Experimental Results and Modeling Techniques for Substrate Noise in Mixed Signal Integrated Circuits", *IEEE Journal of Solid State Circuits*, vol. SC-28, (1993),420-30.

Su, D., et al., "Experimental Results and Modeling Techniques for Substrate Noise in Mixed Signal Integrated Circuits", *IEEE Journal of Solid State Circuits*, 28(4), (1993),pp. 420-430.

Suma, Katsuhiro, et al., "An SOI-DRAM with Wide Operating Voltage Range by CMOS/SIMOX Technology", *IEEE Journal of Solid-State Circuits*, 29(11), (Nov. 1994),pp. 1323-1329.

Sun, J., "CMOS Technology for 1.8V and Beyond", *Int'l Symp. on VLSI Technology, Systems and Applications: Digest of Technical Papers*, (1997),293-297.

Sunouchi, K., et al., "A Surrounding Gate Transistor (SGT) Cell for 64/256Mbit DRAMs", *1989 IEEE International Electron Devices Meeting, Technical Digest*, Washington, D.C.,(Dec. 3-6, 1989),23-26.

Sunouchi, K., et al., "Process Integration for 64M DRAM Using an Asymmetrical Stacked Trench Capacitor (AST) Cell", *1990 IEEE International Electron Devices Meeting*, San Francisco, CA,(Dec. 9-12, 1990),647-650.

Suntola, T., "Atomic Layer Epitaxy", *Handbook of Crystal Growth, 3; Thin Films of Epitaxy, Part B: Growth Mechanics and Dynamics*, Amsterdam,(1994),601-663.

Sze, S M., *VLSI Technology, 2nd Edition*, Mc Graw-Hill, NY, (1988),90.

Takai, M., et al., "Direct Measurement and Improvement of Local Soft Error Susceptibility in Dynamic Random Access Memories", *Nuclear Instruments & Methods in Physics Research*, B-99, (Nov. 7-10, 1994),562-565.

Takao, Y., et al., "A 4-um(2) Full-CMOS SRAM Cell Technology for 0.2-um High Performance Logic LSls", *1997 Symp. on VLSI Technology: Digest of Technical Papers*, Kyoto, Japan,(1997),11-12.

Takato, H., "High Performance CMOS Surrounding Gate Transistor (SGT) for Ultra High Density LSls", *IEEE International Electron Devices Meeting, Technical Digest*, (1988),222-225.

Takato, H., et al., "Impact of Surrounding Gate Transistor (SGT) for Ultra-High Density LSl's", *IEEE Transactions on Electron Devices*, 38, (Mar. 1991),573-578.

Tanabe, N., et al., "A Ferroelectric Capacitor Over Bit-Line (F-COB) Cell for High Density Nonvolatile Ferroelectric Memories", *1995 Symposium on VLSI Technology, Digest of Technical Papers*, Kyoto, Japan,(Jun. 6-8, 1995),123-124.

Temmler, D., "Multilayer Vertical Stacked Capacitors (MVSTC) for 64Mbit and 256Mbit DRAMs", *1991 Symposium on VLSI Technology, Digest of Technical Papers*, Oiso,(May 28-30, 1991), 13-14.

Terauchi, M., "A Surrounding Gate Transistor (SGT) Gain Cell for Ultra High Density DRAMs", *1993 Symposium on VLSI Technology, Digest of Technical Papers*, Kyoto, Japan,(1993),21-22.

Tsui, P. G., et al., "A Versatile Half-Micron Complementary BiCMOS Technology for Microprocessor-Based Smart Power Applications", *IEEE Transactions on Electron Devices*, 42, (Mar. 1995),564-570.

Verdonckt-Vandebroek, S. et al., "High-Gain Lateral Bipolar Action in a MOSFET Structure", *IEEE Transactions on Electron Devices* 38, (Nov. 1991),2487-2496.

Vittal, A., et al., "Clock Skew Optimization for Ground Bounce Control", *1996 IEEE/ACM International Conference on Computer-Aided Design, Digest of Technical Papers*, San Jose, CA,(Nov. 10-14, 1996),395-399.

Wang, N., *Digital MOS Integrated Circuits*, Prentice Hall, Inc., Englewood Cliffs, NJ,(1989),p. 328-333.

Wang, P. W., "Excellent Emission Characteristics of Tunneling Oxides Formed Using Ultrathin Silicon Films for Flash Memory Devices", *Japanese Journal of Applied Physics*, 35, (Jun. 1996),3369-3373.

Watanabe, H., et al., "A New Cylindrical Capacitor Using Hemispherical Grained Si (HSG-Si) for 256Mb DRAMs", *IEEE International Electron Devices Meeting, Technical Digest*, San Francisco, CA,(Dec. 13-16, 1992),259-262.

Watanabe, S., et al., "A Novel Circuit Technology with Surrounding Gate Transistors (SGT's) for Ultra High Density DRAM's", *IEEE Journal of Solid-State Circuits*, 30, (Sep. 1995),960-971.

Watanabe, H., "A Novel Stacked Capacitor with Porous-Si Electrodes for High Density DRAMs", *1993 Symposium on VLSI Technology, Digest of Technical Papers*, Kyoto, Japan,(1993),17-18.

Watanabe, H., "An Advanced Fabrication Technology of Hemispherical Grained (HSG) Poly-Si for High Capacitance Storage Electrodes", *Extended Abstracts of the 1991 International Conference on Solid State Devices and Materials*, Yokohama, Japan,(1991),478-480.

Watanabe, H., "Device Application and Structure Observation for Hemispherical-Grained Si", *J. Appl. Phys.*, 71, (Apr. 1992),3538-3543.

Watanabe, H., "Hemispherical Grained Silicon (HSG-Si) Formation on In-Situ Phosphorous Doped Amorphous-Si Using the Seeding Method", *Extended Abstracts of the 1992 International Conference on Solid State Devices and Materials*, Tsukuba, Japan,(1992),422-424.

Wolf, Stanley, "Isolation Technolgies for Intergrated Circuits", *Silicon Processing for the NLSI Era vol. 2 Process Integration*, (1990),66-78.

Yamada, T., et al., "A New Cell Structure with a Spread Source/Drain (SSD) MOSFET and a Cylindrical Capacitor for 64-Mb DRAM's", *IEEE Transactions on Electron Devices*, 38, (Nov. 1991),2481-2486.

Yamada, T., et al., "Spread Source/Drain (SSD) MOSFET Using Selective Silicon Growth for 64Mbit DRAMs", *1989 IEEE International Electron Devices Meeting, Technical Digest*, Washington, D.C.,(Dec. 3-6, 1989),35-38.

Yoshikawa, K., "Impact of Cell Threshold Voltage Distribution in the Array of Flash Memories on Scaled and Multilevel Flash Cell Design", *1996 Symposium on VLSI Technology, Digest of Technical Papers*, Honolulu, HI,(Jun. 11-13, 1996),240-241.

\* cited by examiner

CIRCUIT AND METHOD FOR A FOLDED BIT LINE MEMORY CELL WITH VERTICAL TRANSISTOR AND TRENCH CAPACITOR

This application is a divisional of U.S. application Ser. No. 10/879,378, filed Jun. 29, 2004, now issued as U.S. Pat. No. 7,057,223 on Jun. 6, 2006, which is a continuation of U.S. application Ser. No. 09/551,027, filed Apr. 17, 2000, now issued as U.S. Pat. No. 6,764,901 on Jul. 20, 2004, which is a divisional of U.S. application Ser. No. 08/939,742, filed Oct. 6, 1997, now issued as U.S. Pat. No. 6,066,869 on May 23, 2000. These applications are incorporated herein by reference.

TECHNICAL FIELD OF THE INVENTION

The present invention relates generally to the field of memory devices and, in particular, to a circuit and method for a folded bit line memory cell with a vertical transistor and a trench capacitor.

BACKGROUND OF THE INVENTION

Electronic systems typically store data during operation in a memory device. In recent years, the dynamic random access memory (DRAM) has become a popular data storage device for such systems. Basically, a DRAM is an integrated circuit that stores data in binary form (e.g., "1" or "0") in a large number of cells. The data is stored in a cell as a charge on a capacitor located within the cell. Typically, a high logic level is approximately equal to the power supply voltage and a low logic level is approximately equal to ground.

The cells of a conventional DRAM are arranged in an array so that individual cells can be addressed and accessed. The array can be thought of as rows and columns of cells. Each row includes a word line that interconnects cells on the row with a common control signal. Similarly, each column includes a bit line that is coupled to at most one cell in each row. Thus, the word and bit lines can be controlled so as to individually access each cell of the array.

A memory array is typically implemented as an integrated circuit on a semiconductor substrate in one of a number of conventional layouts. One such layout is referred to as an "folded digit line" architecture. In this architecture, sense amplifier circuits are provided at the edge of the array. The bit lines are paired in complementary pairs. Each complementary pair in the array feeds into a sense amplifier circuit. The sense amplifier circuit detects and amplifies differences in voltage on the complementary pair of bit lines as described in more detail below.

To read data out of a cell, the capacitor of a cell is accessed by selecting the word line associated with the cell. A complementary bit line that is paired with the bit line for the selected cell is equilibrated with the voltage on the bit line for the selected cell. The equilibration voltage is typically midway between the high and low logic levels. Thus, conventionally, the bit lines are equilibrated to one-half of the power supply voltage, $V_{CC}/2$. When the word line is activated for the selected cell, the capacitor of the selected cell discharges the stored voltage onto the bit line, thus changing the voltage on the bit line.

The sense amplifier detects and amplifies the difference in voltage on the pair of bit lines. The sense amplifier typically includes two main components: an n-sense amplifier and a p-sense amplifier. The n-sense amplifier includes a cross-coupled pair of n-channel transistors that drive the low bit line to ground. The p-sense amplifier includes a cross-coupled pair of p-channel transistors and is used to drive the high bit line to the power supply voltage.

An input/output device for the array, typically an n-channel transistor, passes the voltage on the bit line for the selected cell to an input/output line for communication to, for example, a processor of a computer or other electronic system associated with the DRAM. In a write operation, data is passed from the input/output lines to the bit lines by the input/output device of the array for storage on the capacitor in the selected cell.

Each of the components of a memory device are conventionally formed as part of an integrated circuit on a "chip" or wafer of semiconductor material. One of the limiting factors in increasing the capacity of a memory device is the amount of surface area of chip used to form each memory cell. In the industry terminology, the surface area required for a memory cell is characterized in terms of the minimum feature size, "F," that is obtainable by the lithography technology used to form the memory cell. Conventionally, the memory cell is laid out with a transistor that includes first and second source/drain regions separated by a body or gate region that are disposed horizontally along a surface of the chip. When isolation between adjacent transistors is considered, the surface area required for such a transistor is generally $8F^2$ or $6F^2$.

Some researchers have proposed using a vertical transistor in the memory cell in order to reduce the surface area of the chip required for the cell. Each of these proposed memory cells, although smaller in size from conventional cells, fails to provide adequate operational characteristics when compared to more conventional structures. For example, U.S. Pat. No. 4,673,962 (the '962 Patent) issued to Texas Instruments on Jun. 16, 1997. The '962 Patent discloses the use of a thin poly-silicon field effect transistor (FET) in a memory cell. The poly-silicon FET is formed along a sidewall of a trench which runs vertically into a substrate. At a minimum, the poly-silicon FET includes a junction between poly-silicon channel 58 and the bit line 20 as shown in FIG. 3 of the '962 Patent. Unfortunately, this junction is prone to charge leakage and thus the poly-silicon FET may have inadequate operational qualities to control the charge on the storage capacitor. Other known disadvantages of such thin film poly-silicon devices may also hamper the operation of the proposed cell.

Other researchers have proposed use of a "surrounding gate transistor" in which a gate or word line completely surrounds a vertical transistor. See, e.g., *Impact of a Vertical Φ-shape transistor (VΦT) Cell for 1 Gbit DRAM and Beyond*, IEEE Trans. On Elec. Devices, Vol 42, No.12, December, 1995, pp. 2117–2123. Unfortunately, these devices suffer from problems with access speed due to high gate capacitance caused by the increased surface area of the gate which slows down the rise time of the word lines. Other vertical transistor cells include a contact between the pass transistor and a poly-silicon plate in the trench. Such vertical transistor cells are difficult to implement due to the contact and should produce a low yield.

For the reasons stated above, and for other reasons stated below which will become apparent to those skilled in the art upon reading and understanding the present specification, there is a need in the art for realizable memory cell that uses less surface area than conventional memory cells.

SUMMARY OF THE INVENTION

The above mentioned problems with memory cells and other problems are addressed by the present invention and which will be understood by reading and studying the following specification. A memory cell is described which includes a vertical transistor and trench capacitor.

In particular, an illustrative embodiment of the present invention includes a memory cell for a memory array with a folded bit line configuration. The memory cell includes an access transistor that is formed in a pillar of single crystal semiconductor material. The access transistor has first and second sources/drain regions and a body region that are vertically aligned. The access transistor also includes a gate that is coupled to a wordline disposed adjacent to the body region of the access transistor. A passing wordline is separated from the gate by an insulator for coupling to other memory cells adjacent to the memory cell. A trench capacitor is also included. The trench capacitor includes a first plate that is formed integral with the first source/drain region of the access transistor and a second plate that is disposed adjacent to the first plate and separated from the first plate by a gate oxide. In another embodiment, the second plate of the trench capacitor surrounds the second source/drain region. In another embodiment, an ohmic contact is included to couple the second plate to a layer of semiconductor material.

In another embodiment, a memory device is provided. The memory device includes an array of memory cells. Each memory cell includes a vertical access transistor that is formed of a single crystalline semiconductor pillar that extends outwardly from a substrate. The semiconductor pillar includes a body and first and second source/drain regions. A gate is disposed adjacent to a side of the pillar adjacent to the body region. The memory cell also includes a trench capacitor wherein a first plate of the trench capacitor is integral with the first source/drain region and a second plate of the trench capacitor is disposed adjacent to the first plate. The memory device also includes a number of bit lines that are each selectively coupled to a number of the memory cells at the second source/drain region of the access transistor. This forms columns of memory cells in a folded bit line configuration. Finally, the memory device also includes a number of wordlines. The wordlines are disposed substantially orthogonal to the bit lines in trenches between rows of the memory cells. Each trench includes two wordlines. Each wordline is coupled to gates of alternate access transistors on opposite sides of the trench. In another embodiment, the pillars extend outward from a semiconductor portion of the substrate. In another embodiment, a surface area of the memory cell is four $F^2$, wherein F is a minimum feature size. In another embodiment, a second plate of the trench capacitor surrounds the second source/drain region of the access transistor. In another embodiment, the second plate of the trench capacitor is maintained at approximately ground potential. In another embodiment, the pillar has a submicron width so as to allow substantially full depletion of the body region.

In another embodiment, a memory array is provided. The memory array includes a number of memory cells forming an array with a number of rows and columns. Each memory cell includes an access transistor with body and first and second source/drain regions formed vertically, outwardly from a substrate. A gate is disposed adjacent to a side of the transistor. The memory array includes a number of first isolation trenches that separate adjacent rows of memory cells. First and second wordlines are disposed in each of the first isolation trenches. The first and second wordlines are coupled to alternate gates on opposite sides of the trench. The memory array also includes a number of second isolation trenches, each substantially orthogonal to the first isolation trenches and intraposed between the adjacent memory cell.

In another embodiment, a method of fabricating a memory array is provided. A number of access transistors were formed wherein each access transistor is formed in a pillar of semiconductor material that extends outwardly from a substrate. The access transistor includes a first source/drain region, a body region and second source/drain region that are formed vertically. The method also includes forming a trench capacitor wherein a first plate of the trench capacitor is integral with the first source/drain region of the access transistor. Further, the method includes forming a number of wordlines in a number of trenches that separates adjacent rows of access transistors. Each trench includes two wordlines with the gate of each wordline interconnecting alternate access transistors on opposite sides of the trench. Finally, the method includes a number of bit lines that interconnect second source/drain regions of selected access transistors.

In another embodiment, a method of fabricating a memory is provided. The method begins with forming a first conductivity type first source/drain region layer on a substrate. A second conductivity type body region layer is formed on the first source/drain region layer. A first conductivity type second source/drain region layer is formed on the body region layer. Additionally, a plurality of substantially parallel column isolation trenches are formed extending through the second source/drain region layer, the body region layer and the first source/drain region layer. This provides column bars between the column isolation trenches. Further, a plurality of substantially parallel row isolation trenches are formed orthogonal to the column isolation trenches and extending to substantially the same depth as the column isolation trenches. This produces an array of vertical access transistors for the memory array. The row and column isolation trenches are filled with a conductive material to a level that does not exceed the lower level of the body region so as to provide a common plate for capacitors of the memory cells of the memory array. Two conductive wordlines are formed in each row isolation trench to selectively interconnect alternate access transistors on opposite sides of the row isolation trench. Finally, bit lines are formed to selectively interconnect the second source/drain regions of the access transistors on each column.

DETAILED DESCRIPTION OF THE INVENTION

In the following detailed description of the invention, reference is made to the accompanying drawings which form a part hereof, and in which is shown, by way of illustration, specific embodiments in which the invention maybe practiced. The embodiments are intended to describe aspects of the invention in sufficient detail to enable those skilled in the art to practice the invention. Other embodiments may be utilized and logical, mechanical and electrical changes may be made without departing from the scope of the present invention. The following detailed description is, therefore, not to be taken in a limiting sense.

In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art.

The term "horizontal" as used in this application is defined as a plane parallel to the conventional plane or surface of a wafer or substrate, regardless of the orientation of the wafer or substrate. The term "vertical" refers to a direction perpendicular to the horizonal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate.

Figure 1:
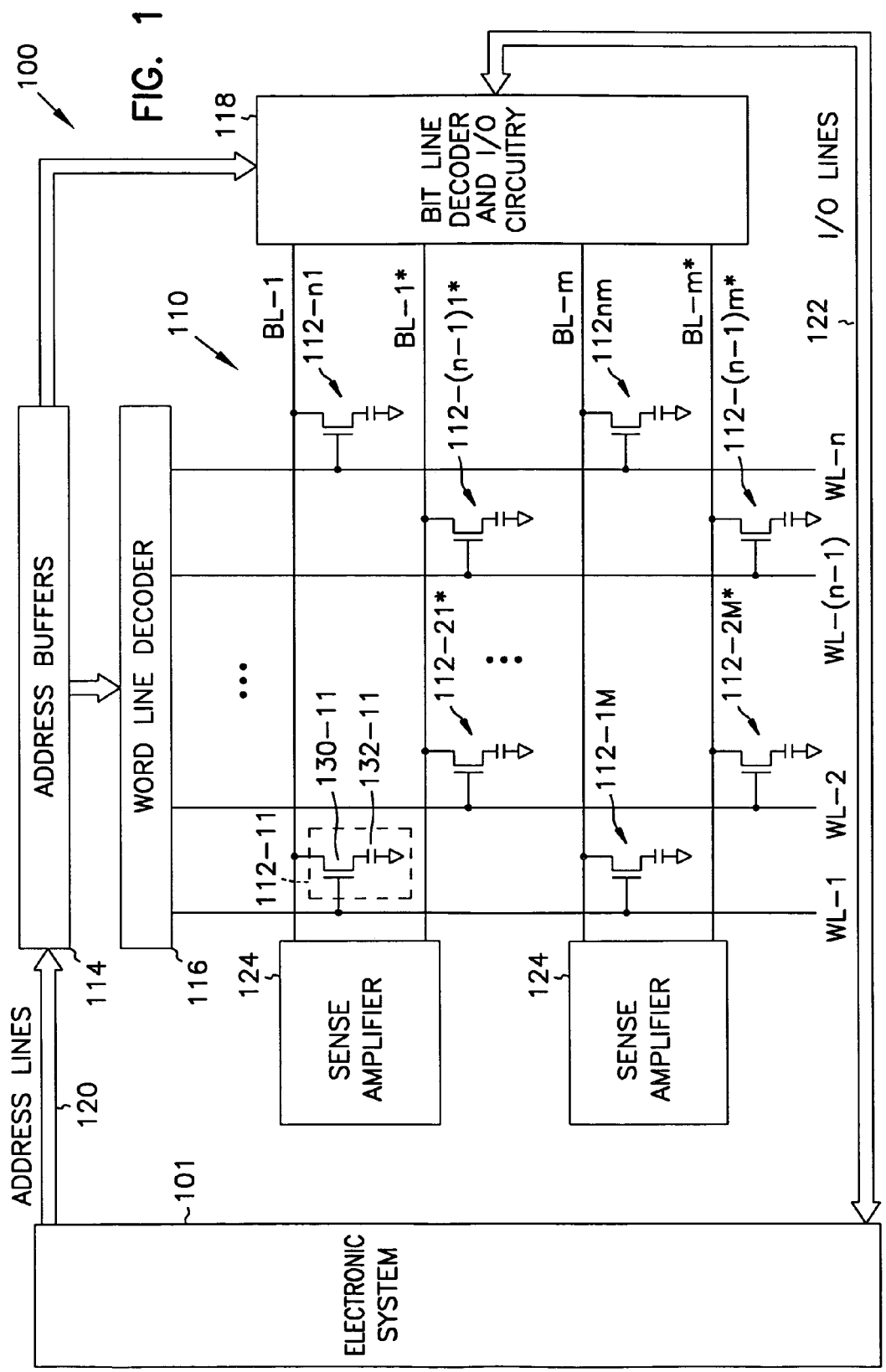
FIG. 1 is a block/schematic diagram of an illustrative embodiment of the present invention that includes a memory device that is coupled to an electronic system.

FIG. 1 is a block/schematic diagram that illustrates generally one embodiment of a memory device 100 incorporating an array of memory cells constructed according to the teachings of the present invention. Memory device 100 is coupled to electronic system 101. Electronic system 101 may comprise, for example, a microprocessor, a memory controller, a chip set or other appropriate electronic system. Memory device 100 illustrates, by way of example but not by way of limitation, a dynamic random access memory (DRAM), in a folded bit line configuration. Memory device 100 includes array 110 with N word lines and M complementary bit line pairs. Array 110 further includes memory cells 112-ij, where i refers to the word line of the cell and j refers to the bit line of the cell. It is noted that an asterisk (*) is used to indicate a cell that is associated with a complementary bit line.

In the exemplary embodiment of FIG. 1, each of memory cells 112-ij has a substantially identical structure, and accordingly, only one memory cell is described herein. These memory cells 112-ij include a vertical transistor where one plate of a capacitor is integral with the transistor.

The vertical transistors are laid out in a substantially checker-board pattern of rows and columns on a substrate. Memory cell 112-11 includes vertical transistor 130-11. A source/drain region of transistor 130-11 is formed in a deep trench and extends to a sufficient depth to form a storage node of storage capacitor 132-11. The other terminal of storage capacitor 132-11 is part of a mesh or grid of poly-silicon that surrounds the source/drain region of transistor 130-11 and is coupled to ground potential.

The N word lines, WL-1 through WL-N, are formed in trenches that separate adjacent rows of vertical transistors 130-ij. Each trench houses two word lines, with each word line in a trench acting as a gate for alternate transistors on one side of the trench.

Bit lines BL-1 through BL-M are used to write to and read data from memory cells 112-ij in response to addressing circuitry. For example, address buffer 114 is coupled to control bit line decoder 118, which also includes sense amplifiers and input/output circuitry that is coupled to bit lines BL-1 through BL-M and complement bit lines BL-1* through BL-M* of array 110. Address buffer 114 also is coupled to control word line decoder 116. Word line decoder 116 and bit line decoder 118 selectably access memory cells 112-ij in response to address signals that are provided on address lines 120 from electronic system 101 during write and read operations.

In operation, memory 100 receives an address of a particular memory cell at address buffer 114. For example, electronic system 101 may provide address buffer 114 with the address for cell 112-11 of array 110. Address buffer 114 identifies word line WL-1 for memory cell 112-11 to word line decoder 116. Word line decoder 116 selectively activates word line WL-1 to activate access transistor 130-1j of each memory cell 112-1j that is connected to word line WL-1. Bit line decoder 118 selects bit line BL-1 for memory cell 112-11. For a write operation, data received by input/output circuitry is coupled to bit lines BL-1 through access transistor 130-11 to charge or discharge storage capacitor 132-11 of memory cell 112-11 to represent binary data. For a read operation, bit line BL-1 of array 110 is equilibrated with bit line BL-1*. Data stored in memory cell 112-11, as represented by the charge on its storage capacitor 132-11, is coupled to bit line BL-1 of array 110. The difference in charge in bit line BL-1 and bit line BL-1* is amplified, and a corresponding voltage level is provided to the input/output circuits.

Figure 2:
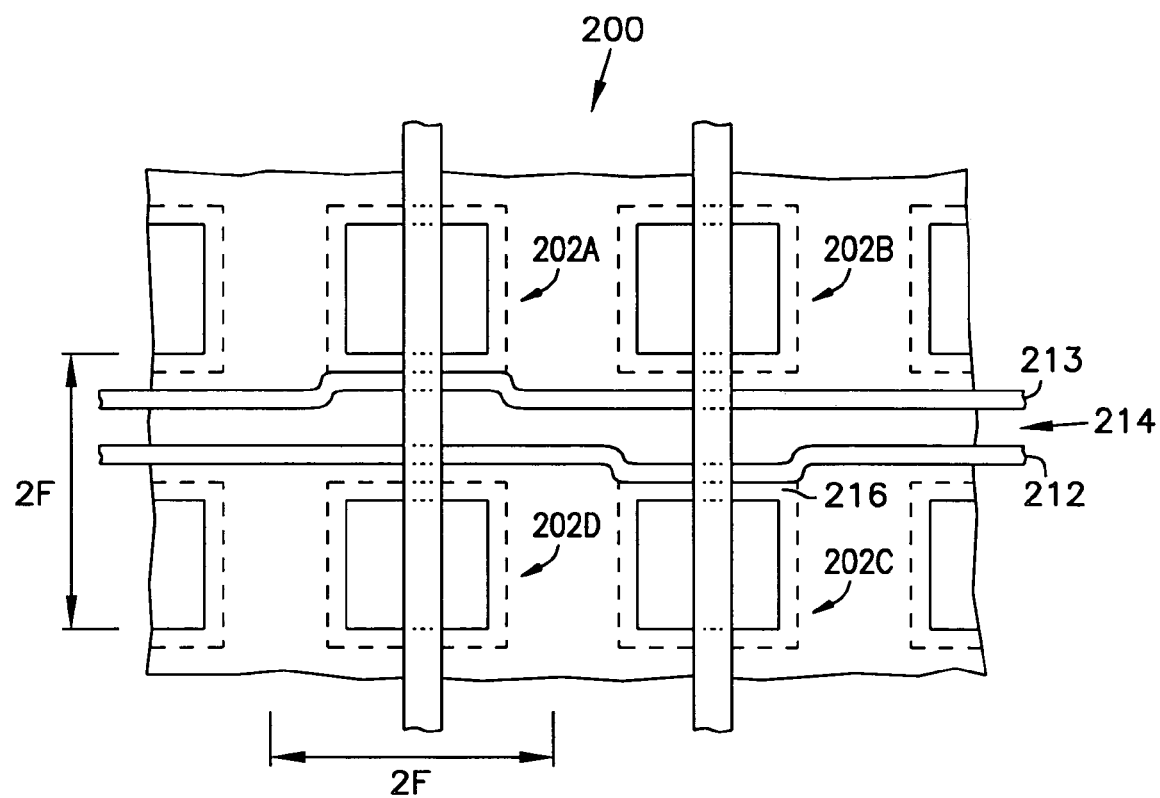
FIG. 2 is a plan view of an illustrative embodiment of a layout for a memory array according to the teachings of the present invention.
Figure 3:
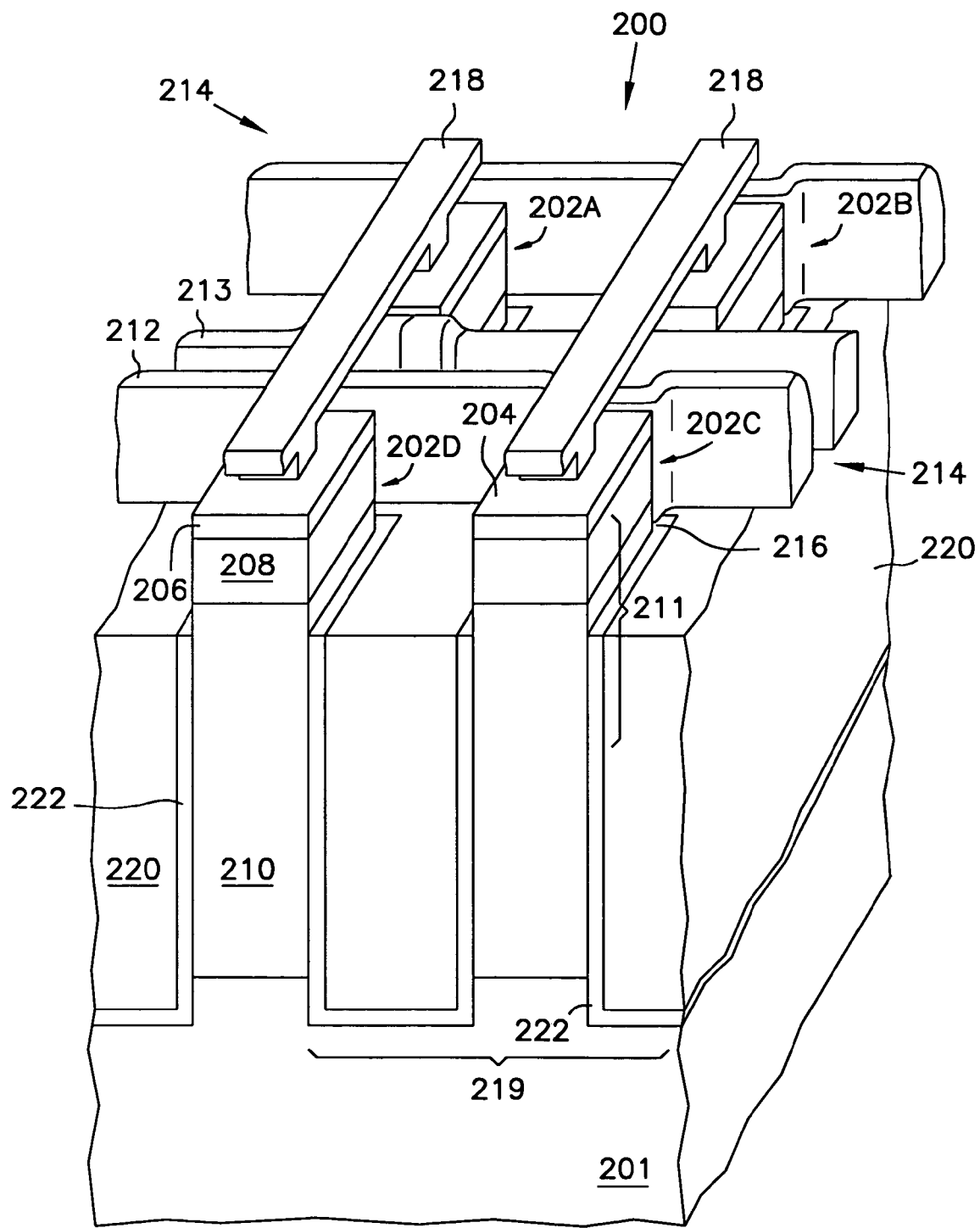
FIG. 3 is a perspective view of the illustrative embodiment of FIG. 2.
Figure 4:
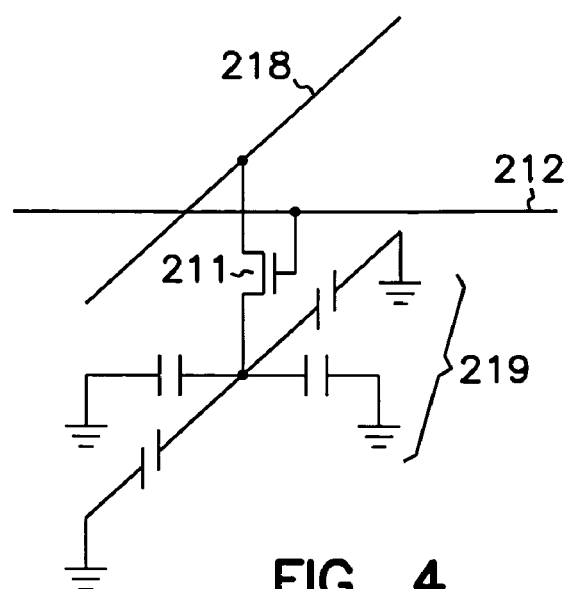
FIG. 4 is a schematic diagram of a memory cell of the embodiment of FIGS. 2 and 3.

FIGS. 2 through 4 illustrate an embodiment of a memory cell with a vertical transistor and trench capacitor for use, for example, in memory device 100 of FIG. 1. Specifically, FIG. 2 is a plan view of a layout of a number of memory cells indicated generally at 202A through 202D in array 200. FIG. 2 depicts only four memory cells. It is understood, however, that array 200 may include a larger number of memory cells even though only four are depicted here.

Each memory cell is constructed in a similar manner. Thus, only memory cell 202C is described herein in detail. Memory cell 202C includes pillar 204 of single crystal semiconductor material, e.g., silicon, that is divided into second source/drain region 206, body region 208, and first source/drain region 210 to form access transistor 211. Pillar 204 extends vertically outward from substrate 201 of, for example, p– silicon. Second source/drain region 206 and first source/drain region 210 each comprise, for example, n+ silicon and body region 208 comprises p– silicon.

Word line 212 passes body region 208 of access transistor 211 in isolation trench 214. Word line 212 is separated from body region 208 of access transistor 211 by gate oxide 216 such that the portion of word line 212 adjacent to body region 208 operates as a gate for access transistor 211. Word line 212 may comprise, for example, n+ poly-silicon material that is deposited in isolation trench 214 using an edge-defined technique such that word line 212 is less than a minimum feature size, F, for the lithographic technique used to fabricate array 200. Passing word line 213 is also formed in trench 214. Cell 202C is coupled with cell 202B by bit line 218.

Memory cell 202C also includes storage capacitor 219 for storing data in the cell. A first plate of capacitor 219 for memory cell 202C is integral with first source/drain region 210 of access transistor 211. Thus, memory cell 202C may be more easily realizable when compared to conventional vertical transistors since there is no need for a contact between first source/drain region 210 and capacitor 219. Second plate 220 of capacitor 219 is common to all of the capacitors of array 200. Second plate 220 comprises a mesh or grid of n+ poly-silicon formed in deep trenches that surrounds at least a portion of first source/drain region 210 of each pillar 204A through 204D. Second plate 220 is grounded by contact with substrate 201 underneath the trenches. Second plate 220 is separated first source/drain region 210 by gate oxide 222.

With this construction for memory cell 202C, access transistor 211 is like a silicon on insulator device. Three sides of the transistor are insulated by thick oxide in the shallow trench. If the doping in pillar 204 is low and the width of the post is sub-micron, then body region 208 can act as a "fully-depleted" silicon on insulator transistor with no body or substrate to contact. This is desirable to avoid floating body effects in silicon on insulated transistors and is achievable due to the use of sub-micron dimensions in access transistor 211.

FIG. 4 is a schematic diagram that illustrates an effective circuit diagram for the embodiment of FIGS. 2 and 3. It is noted that storage capacitor 219 formed by first source/drain region 210 and second plate 220 is depicted as four separate capacitors. This represents that the first plate 220 surrounds second source/drain region 210 which increases the charge storage capacitance and stored charge for the memory cell. It is also noted that second plate 220 is maintained at a constant potential, e.g., ground potential.

As shown in FIG. 2, the memory cells of array 200 are four-square feature ($4F^2$) memory cells. Using cell 202D as an example, the surface area of cell 202D is calculated based on linear dimensions in the bit line and word line directions. In the bit line direction, the distance from one edge of cell 202D to a common edge of adjacent cell 202A is approximately 2 minimum feature sizes (2F). In the word line direction, the dimension is taken from the midpoint of isolation trenches on either side of memory cell 202D. Again, this is approximately two minimum feature sizes (2F). Thus, the size of the cell is $4F^2$. This size is much smaller than the current cells with stacked capacitors or trenched capacitors.

FIGS. 5A through 5M illustrate one embodiment of a process for fabricating an array of memory cells, indicated generally at 299, according to the teachings of the present invention. In this example, dimensions are given that are appropriate to a 0.2 micrometer lithographic image size. For other image sizes, the vertical dimensions can be scaled accordingly.

Figure 5A:
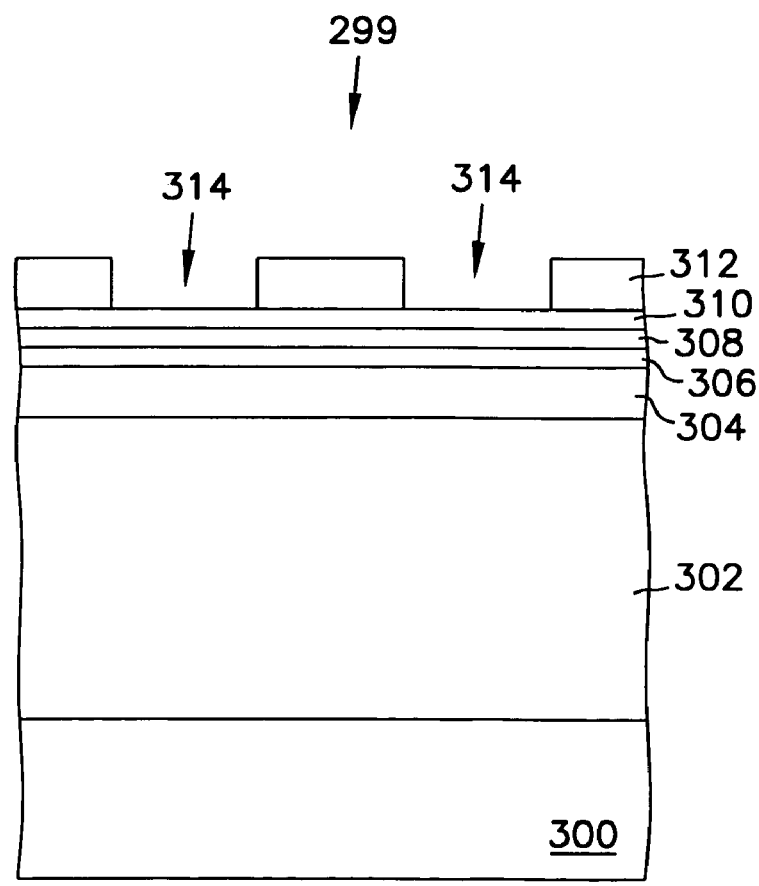
FIGS. 5A through 5M are perspective and elevational views of an embodiment of an integrated circuit that illustrate processing steps for fabricating the integrated circuit according to the teachings of the present invention.

As shown in FIG. 5A, the method begins with substrate 300. Substrate 300 comprises, for example, a P-type silicon wafer, layer of P– silicon material, or other appropriate substrate material. As shown in FIG. 5A, substrate 300 is a single unbonded substrate. Layer 302 is formed, for example, by epitaxial growth outwardly from layer 300. Layer 302 comprises single crystalline N+ silicon that is approximately 3.5 micrometers thick. Layer 304 is formed outwardly from layer 302 by epitaxial growth of single crystalline P– silicon of approximately 0.5 microns. Layer 306 is formed by ion implantation of donor dopant into layer 304 such that layer 306 comprises single crystalline N+ silicon with a depth of approximately 0.1 microns.

A thin layer of silicon dioxide ($SiO_2$), referred to as pad oxide 308, is deposited or grown on layer 306. Pad oxide 308 has a thickness of approximately 10 nanometers. A layer of silicon nitride ($Si_3N_4$), referred to as pad nitride 310, is deposited on pad oxide 308. Pad nitride 310 has a thickness of approximately 200 nanometers.

Figure 5B:
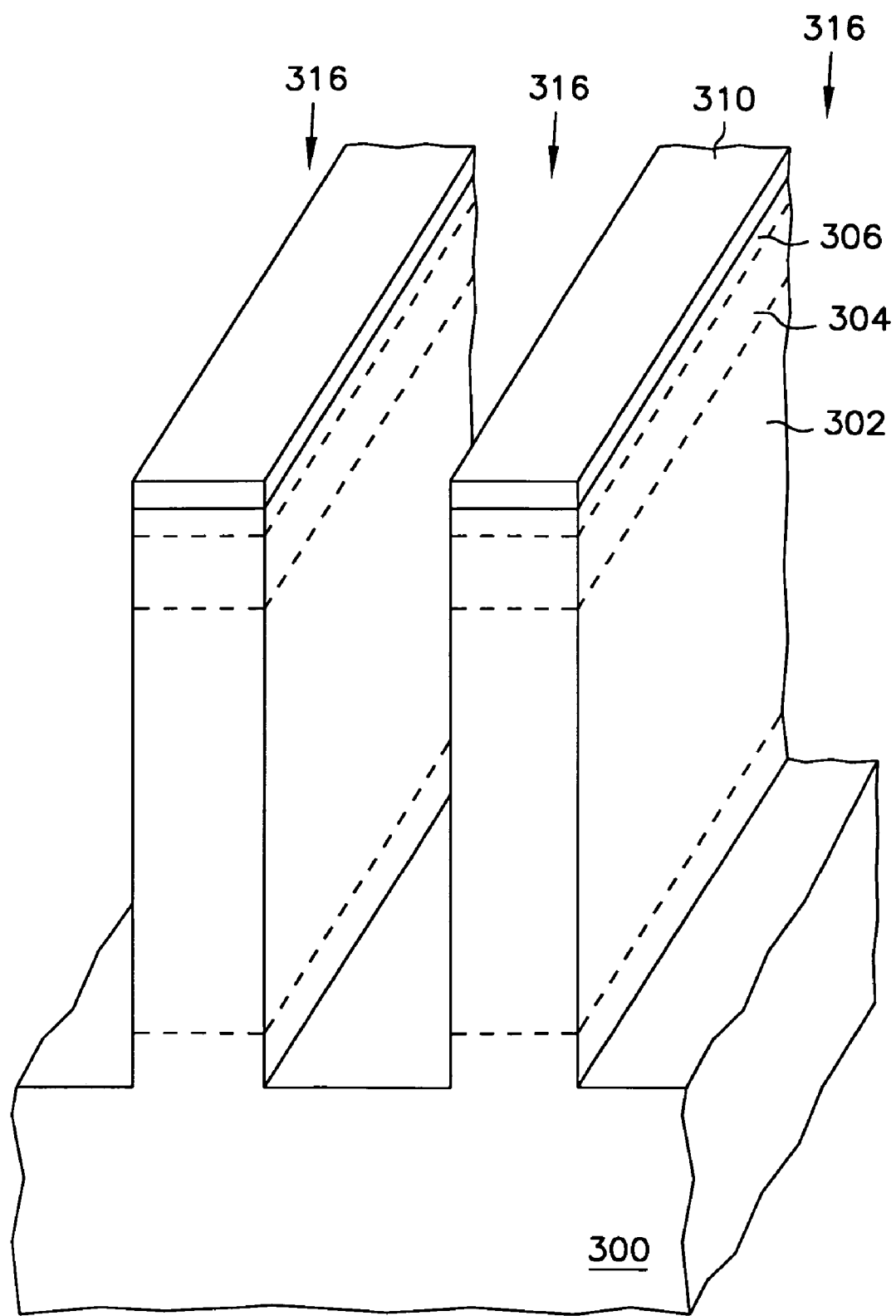
Figure 5C:
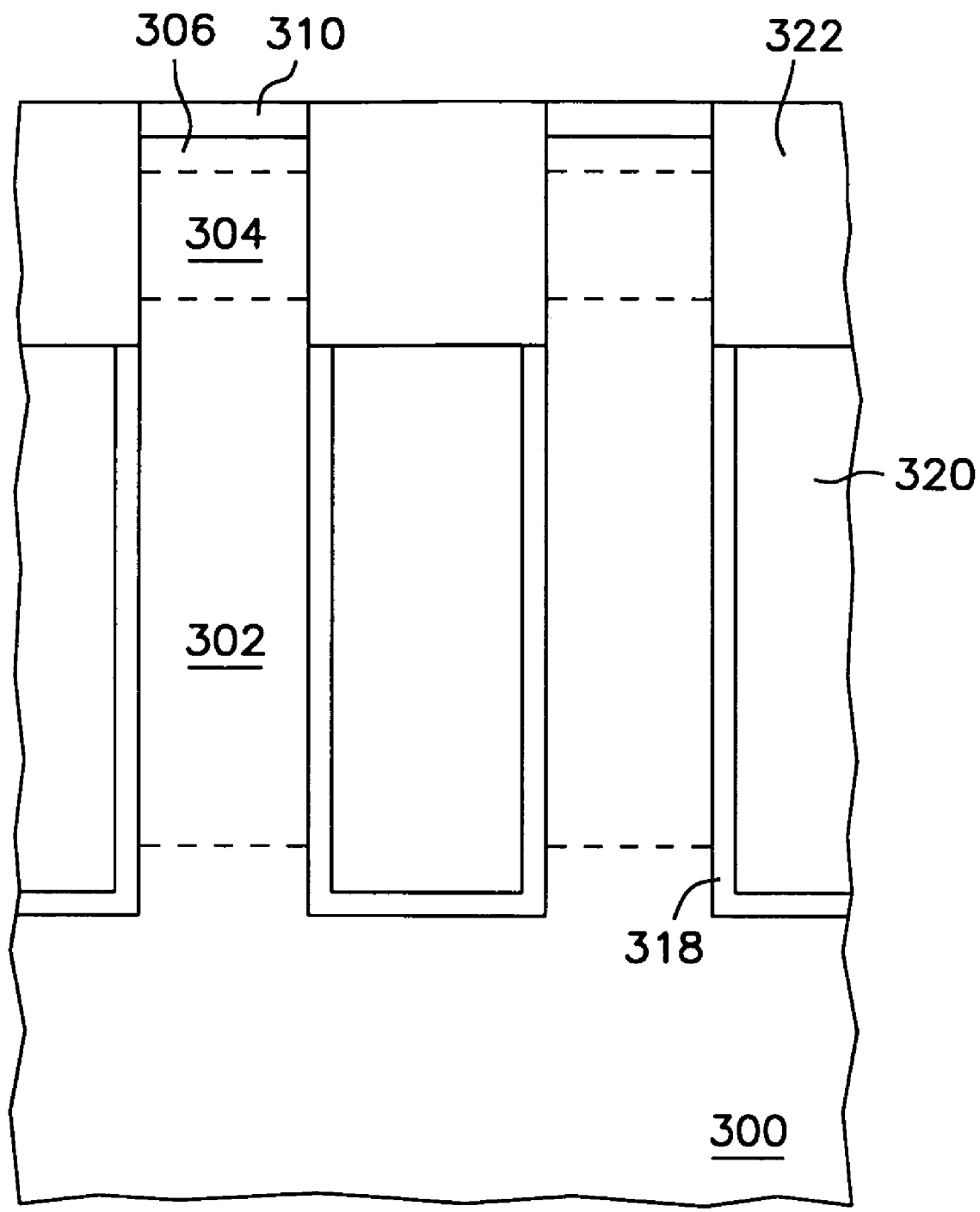

Photo resist layer 312 is deposited outwardly from layer 310. Photo resist layer 312 is patterned with a mask to define openings 314 in layer 312 to be used in selective etching. As shown in FIG. 5B, column isolation trenches 316 are etched through openings 314 in photo resist layer 312 in a direction parallel to which the bit lines will be formed. Column isolation trenches 316 extend down through nitride layer 310, oxide layer 308, N+ layer 306, P– layer 304, N+ layer 302, and into substrate 300.

A thin thermal protective oxide layer 318 is grown on exposed surfaces of substrate 300 and layers 302, 304, and 306. Layer 318 is used to protect substrate 300 and layers 302, 304 and 306 during subsequent process step.

A layer of intrinsic poly-silicon 320 is deposited by chemical vapor deposition (CVD) to fill column isolation trenches 316. Layer 320 is etched by reactive ion etching (RIE) such that layer 320 is recessed below a top of layer 302. Layer 322 of silicon nitride ($Si_3N_4$) is deposited by, for example, chemical vapor deposition to fill trenches 316. Layer 322 is planarized back to a level of layer 310 using, for example, chemical mechanical polishing (CMP) or other suitable planarization technique to produce the structure shown in FIG. 5C.

Figure 5D:
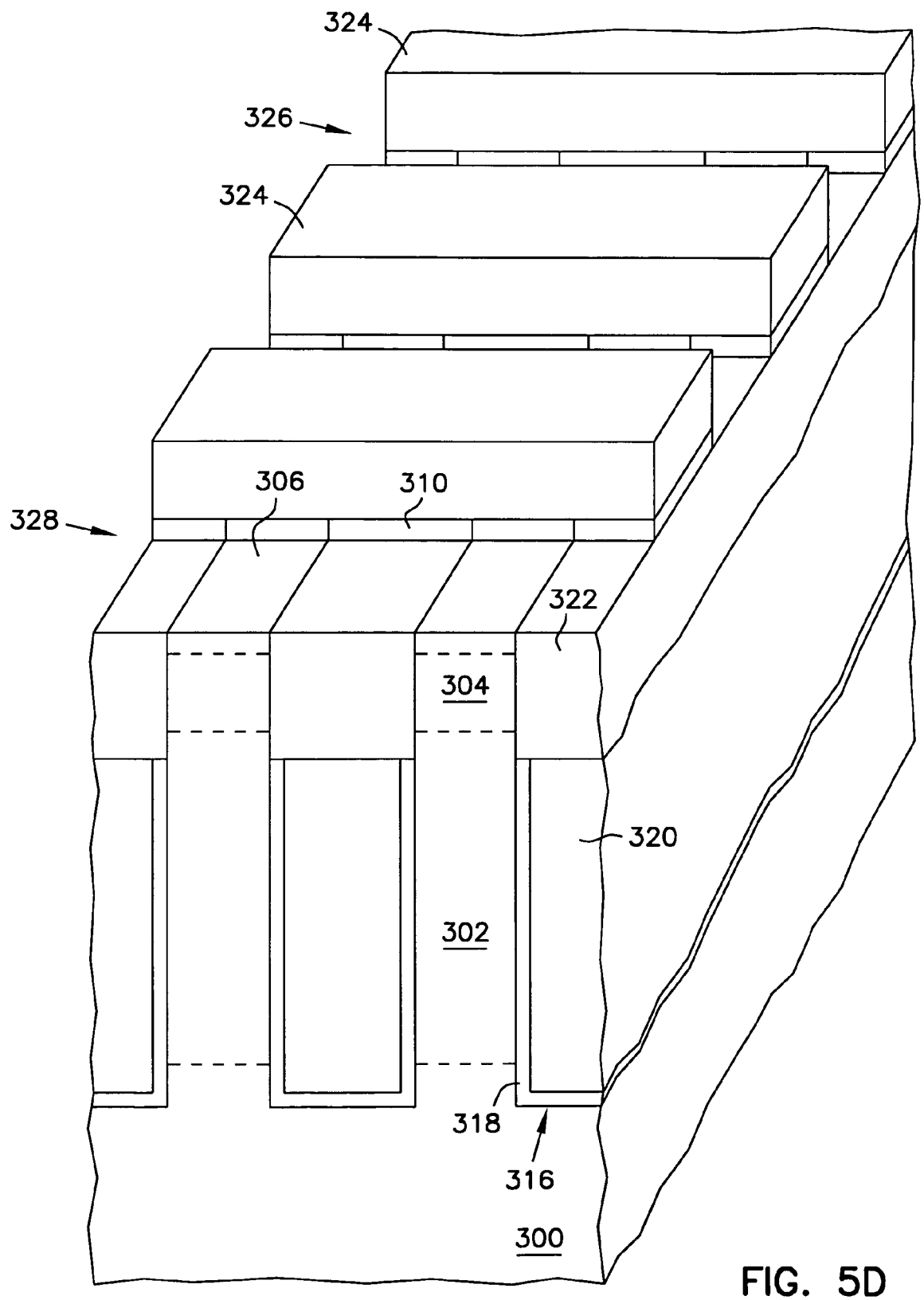

As shown in FIG. 5D, layer 324 of photo resist material is deposited outwardly from nitride layers 322 and 310. Layer 324 is exposed through a mask to define openings 326 in layer 324. Openings 326 are orthogonal to trenches 316 that were filled by intrinsic poly-silicon layer 320 and nitride layer 322. Next, nitride layers 310 and 322 are etched to a depth sufficient to expose a working surface 328 of layer 306. It is noted that at this point layer 320 of intrinsic poly-silicon is still covered by a portion of nitride layer 322.

Figure 5E:
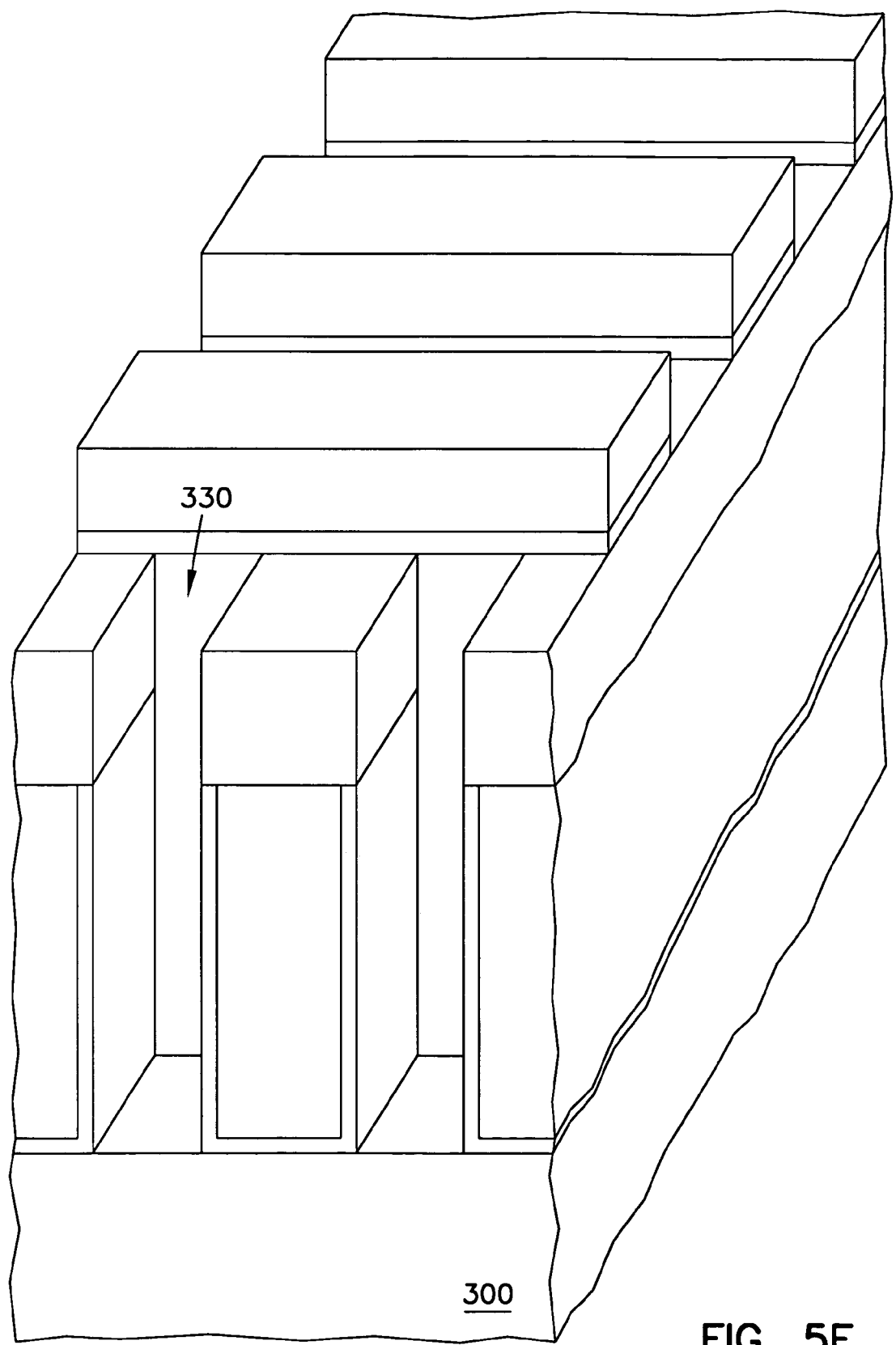

As shown in FIG. 5E, the portion of layers 306, 304, and 302 that are exposed in openings 326 are selectively etched down to a distance approximately equal to column isolation trenches 316. A thin thermal protective oxide is grown on the exposed silicon of layers 302, 304 and 306 as well as an exposed upper surface of layer 300. This oxide layer is labeled 330 in FIG. 5E.

Figure 5F:
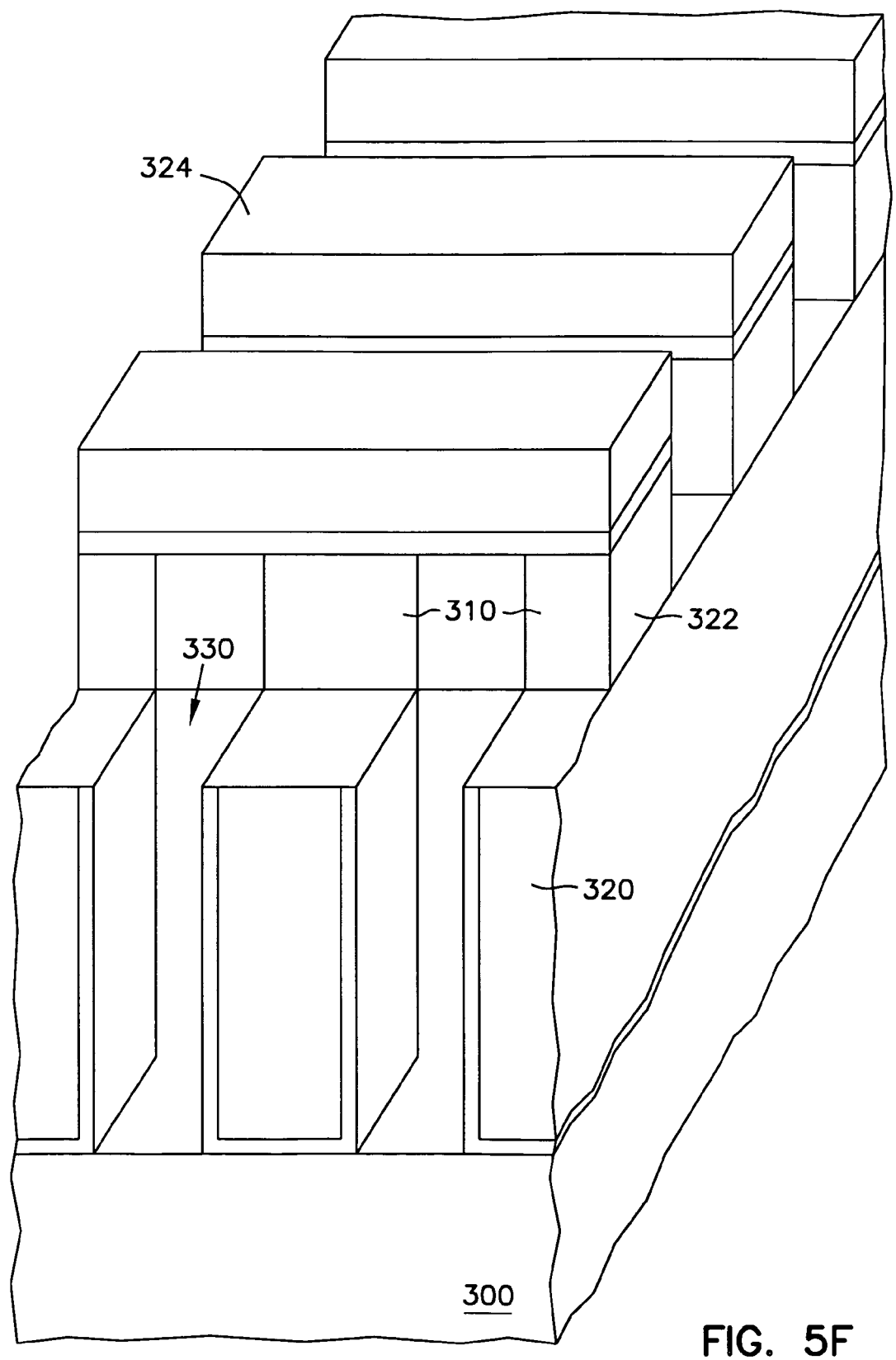
Figure 5G:
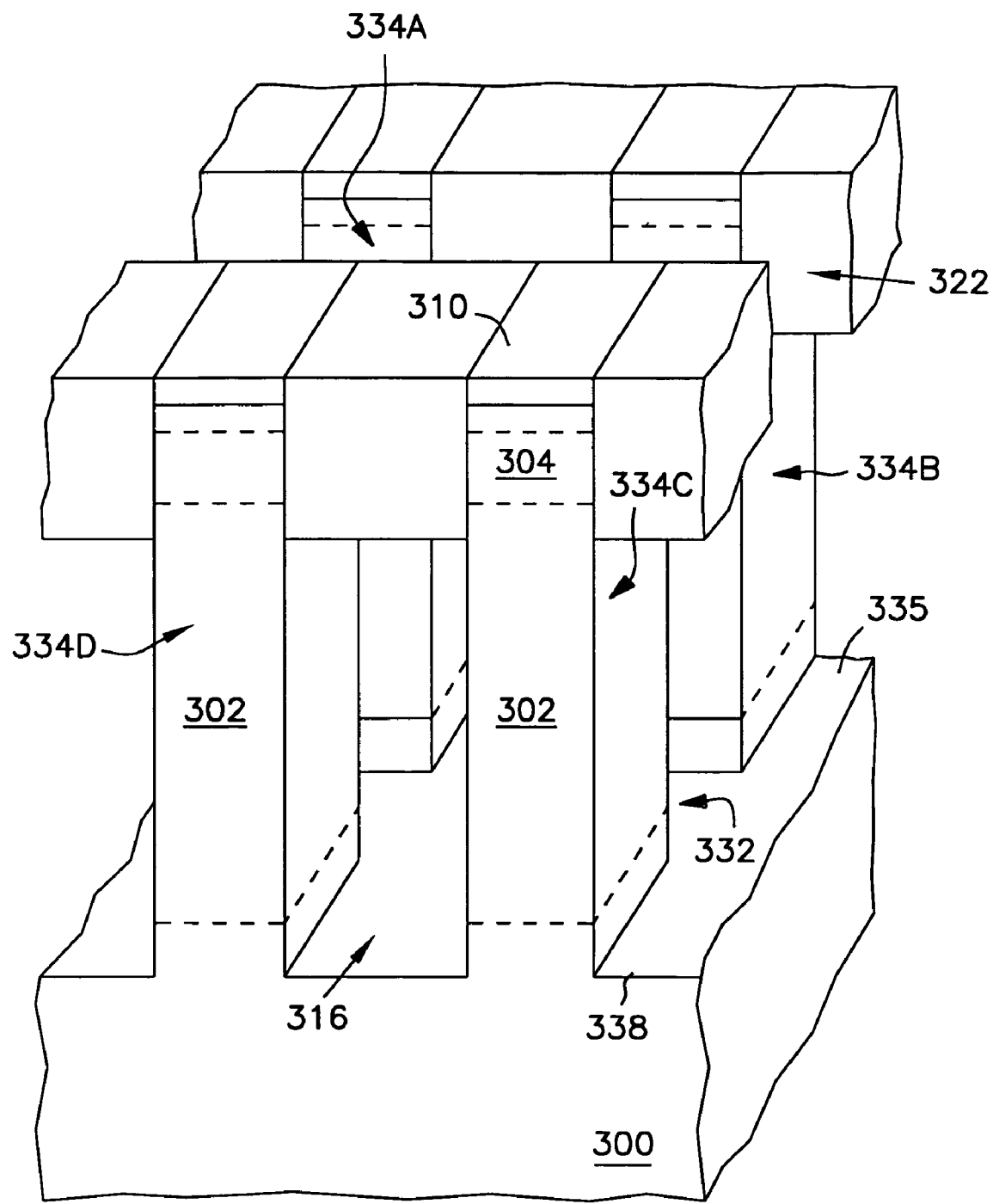

As shown in FIG. 5F, the remaining nitride layer 322 exposed in openings 326 is directionally etched to expose layer of intrinsic poly-silicon 320. It is noted that nitride layer 322 and nitride layer 310 remain intact under the photo resist layer 324. Layer of intrinsic poly-silicon 320 is next isotropically etched using a silicon etchant which does not attack oxide or nitride layers. Next, an isotropic oxide etch is performed to remove all exposed thin oxide. The photo resist layer 324 is removed. At this point, the method has produced the structure shown in FIG. 5G. This structure includes a nitride bridge formed from nitride layers 310 and 322 that extends orthogonal to column isolation trenches 316 and covers the remaining portions of layers 302, 304, and 306. The structure also includes row isolation trenches 332 that are orthogonal to column isolation trenches 316. The structure of FIG. 5G also includes pillars 334A through 334D of single crystal silicon material. Pillars 334A through 334D form the basis for individual memory cells for the memory array formed by the process.

An optional metal contact 336 may be formed by, for example, deposition of a collimated refractory metal deposition, e.g., titanium, tungsten, or a similar refractory metal. This provides an ohmic metal contact for a capacitor plate on a surface 335 of substrate 300.

Dielectric layer 338 is deposited or grown on sidewalls of layer 302 of pillars 334A through 334D. Layer 338 acts as the dielectric for the storage capacitors of array 299 of memory cells. If contact 336 was previously deposited on a surface of substrate 300, dielectric layer 338 should be directionally etched to clear dielectric material from the bottom of row isolation trench 332.

Figure 5H:
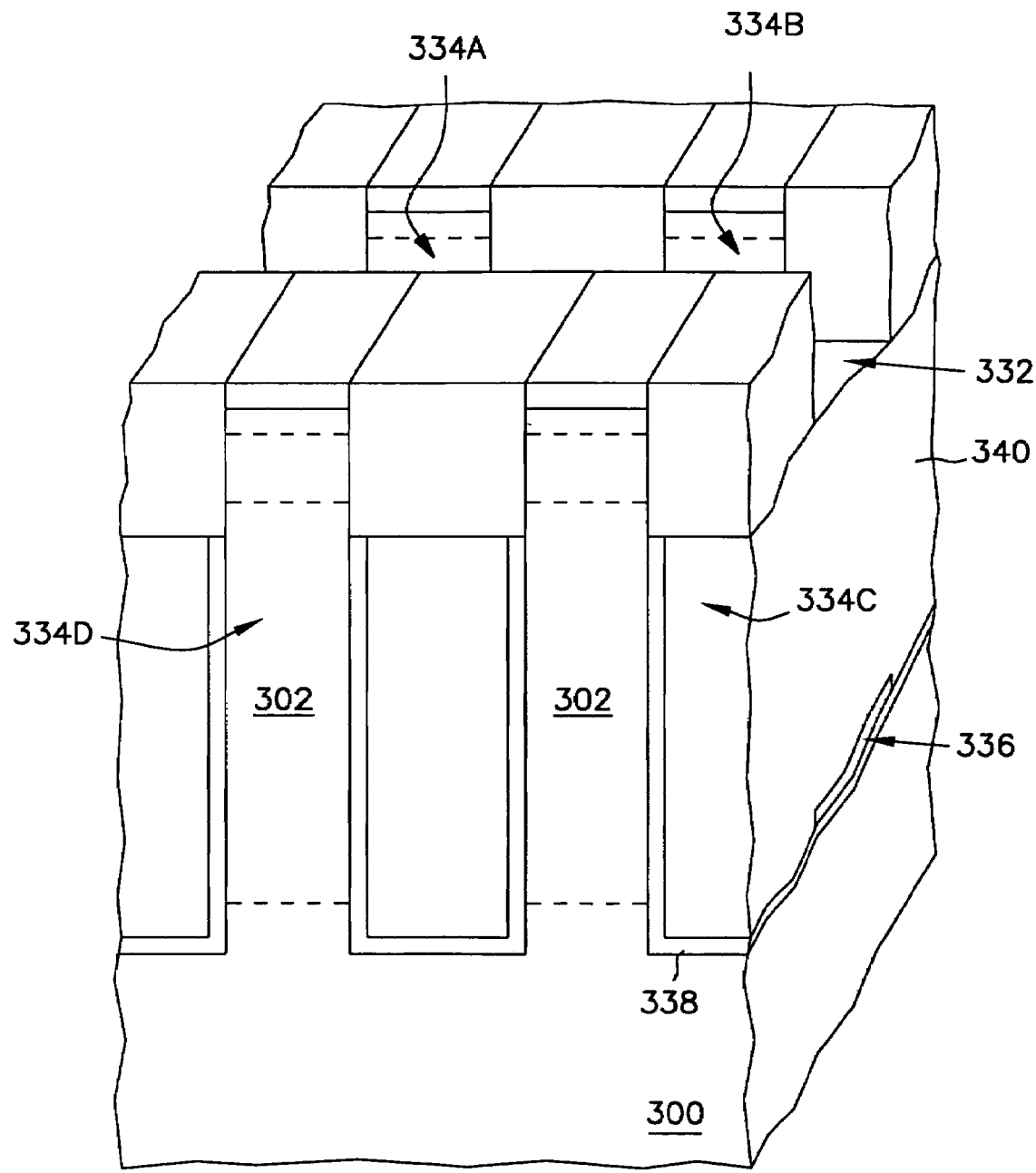

Next, a common plate for all of the memory cells of array 299 is formed by a chemical vapor deposition of N+ poly-silicon or other appropriate refractory conductor in column isolation trenches 316 and row isolation trenches 332. In this manner, conductor mesh or grid 340 is formed so as to surround each of pillars 334A through 334D. Mesh 340 is planarized and etched back to a level approximately at the bottom of the nitride bridge formed by nitride layers 322 and 310 as shown in FIG. 5H. An additional etch is performed to remove any remaining exposed capacitor dielectric of layer 338 from the sides of semiconductor pillars 334A through 334D.

Figure 5I:
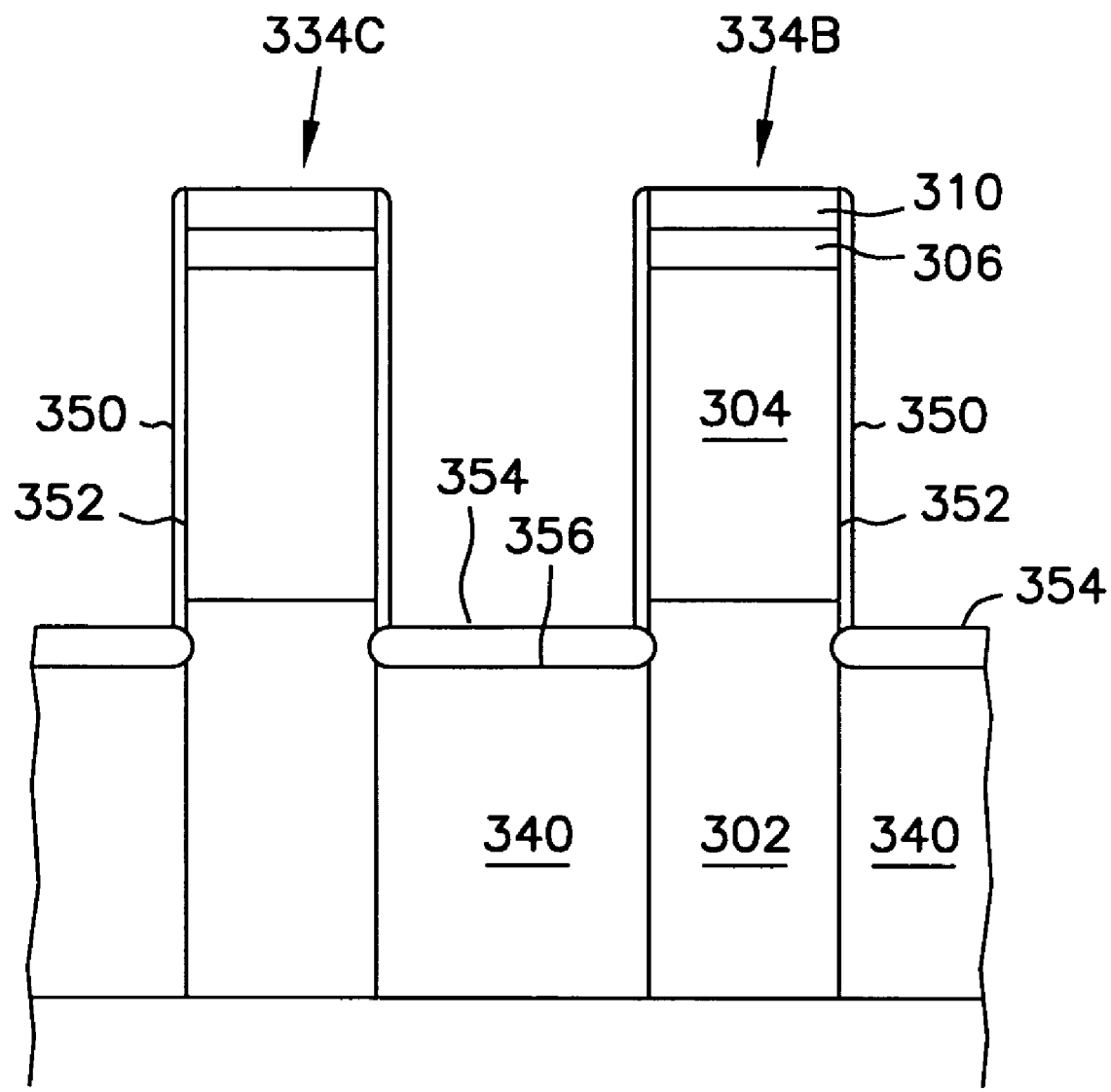

Referring to FIG. 5I, layer 350 of silicon nitride ($Si_3N_4$) is formed by, for example, chemical vapor deposition to a thickness of approximately 20 nanometers. Layer 350 is directionally etched to leave silicon nitride on sidewalls 352 of pillars 344B and 344C as shown in FIG. 5I. It is noted that silicon nitride is also deposited on the sidewalls of pillars 334A and 334B. Layer 354 of thermal silicon dioxide ($SiO_2$) is grown or deposited to a depth of approximately 100 nanometers on exposed surfaces 356 of mesh 340. Layer 350 is then removed.

Figure 5J:
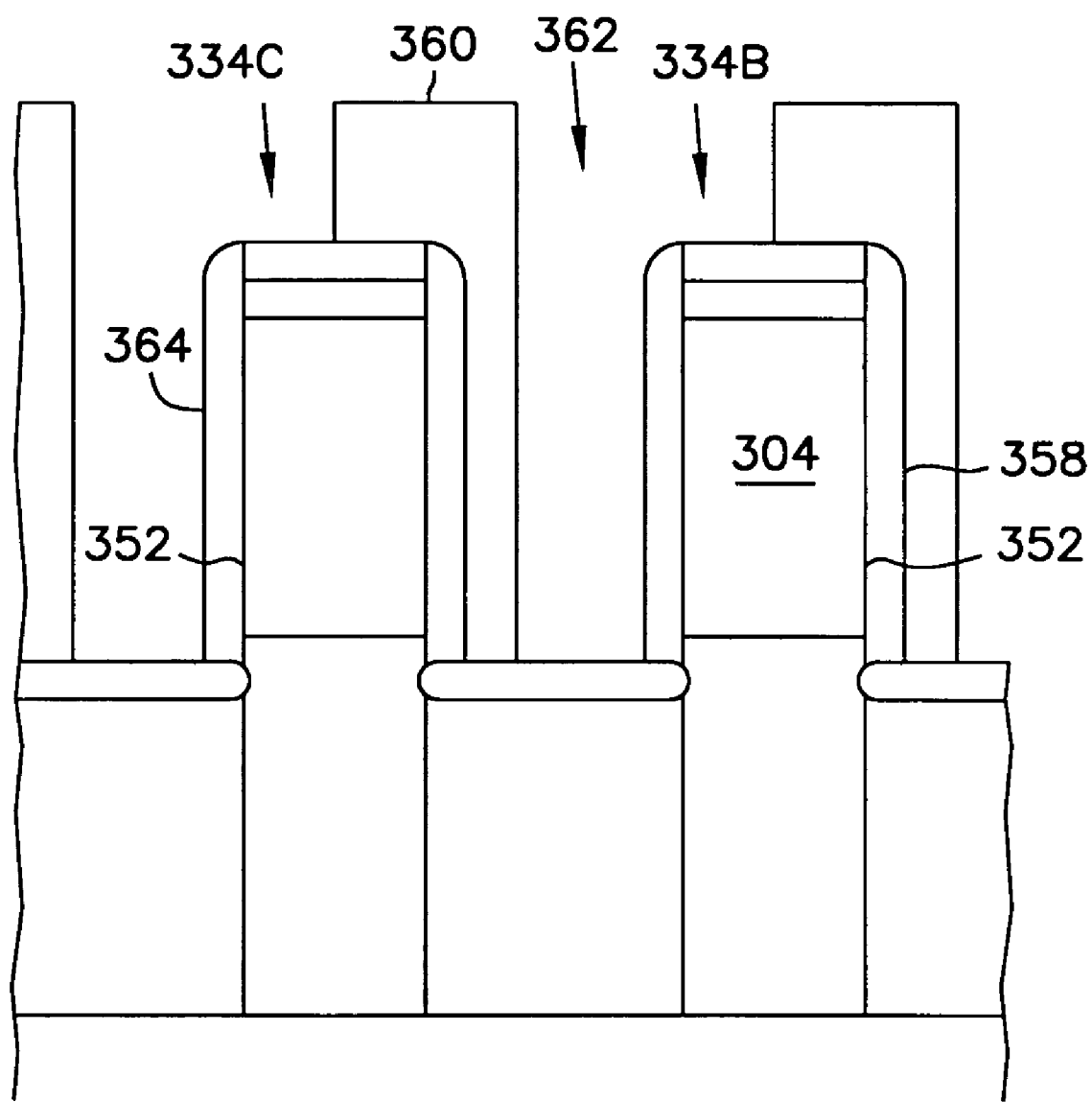

Referring to FIG. 5J, layer 358 of intrinsic poly-silicon is deposited, for example, by chemical vapor deposition with a thickness of approximately 50 nanometers. Layer 358 is directionally etched to the leave intrinsic poly-silicon on sidewalls 352 of pillars 334B and 334C as shown in FIG. 5J. It is noted that layer 358 is also formed on pillars 334A and 334D.

Figure 5K:
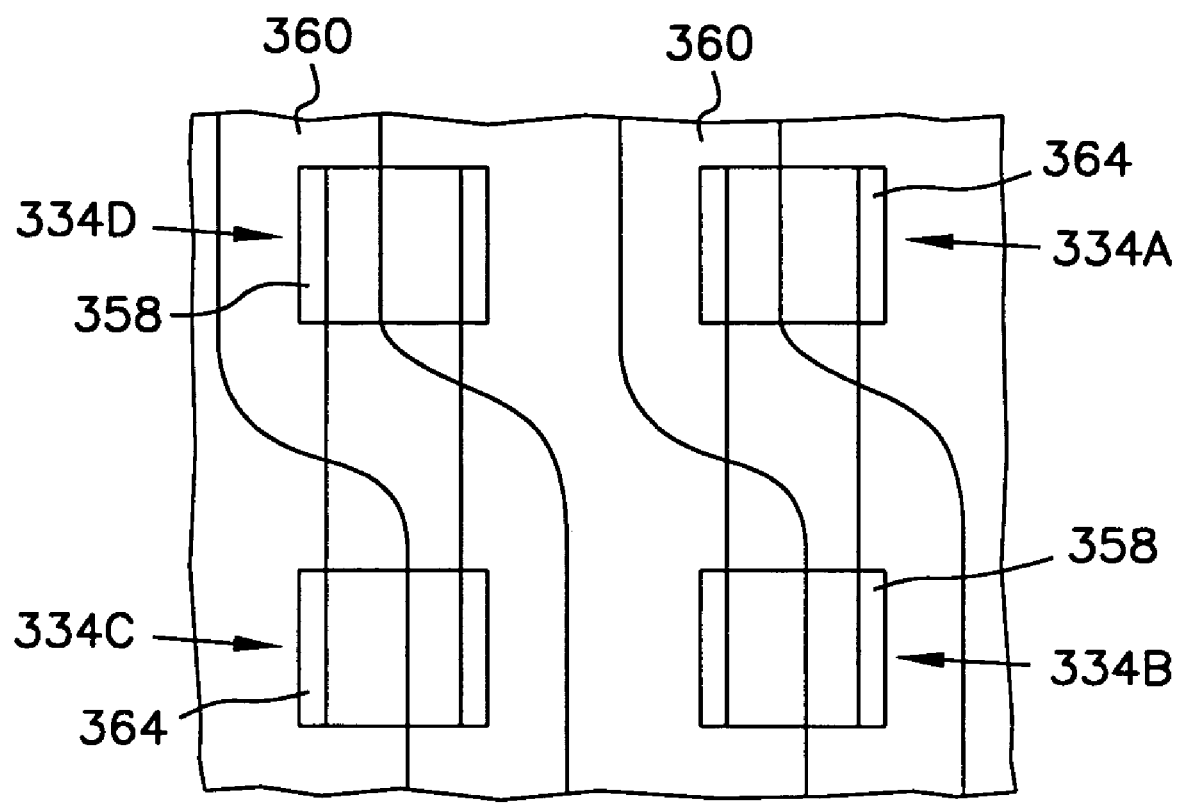

As shown in FIGS. 5J and 5K, layer 360 of photo resist material is deposited and masked to expose alternate sidewalls 352 of pillars 334A through 334D. Exposed portions of layer 358 in openings 362 through photo resist layer 360 are selectively etched to expose sidewalls 352 of pillars 334A through 334D. Photo resist layer 360 is removed and gate oxide layer 364 is grown on exposed sidewalls 352 of pillars 334A through 334D. Additionally, gate oxide layer 364 is also deposited on remaining intrinsic poly-silicon layers 358.

Figure 5L:
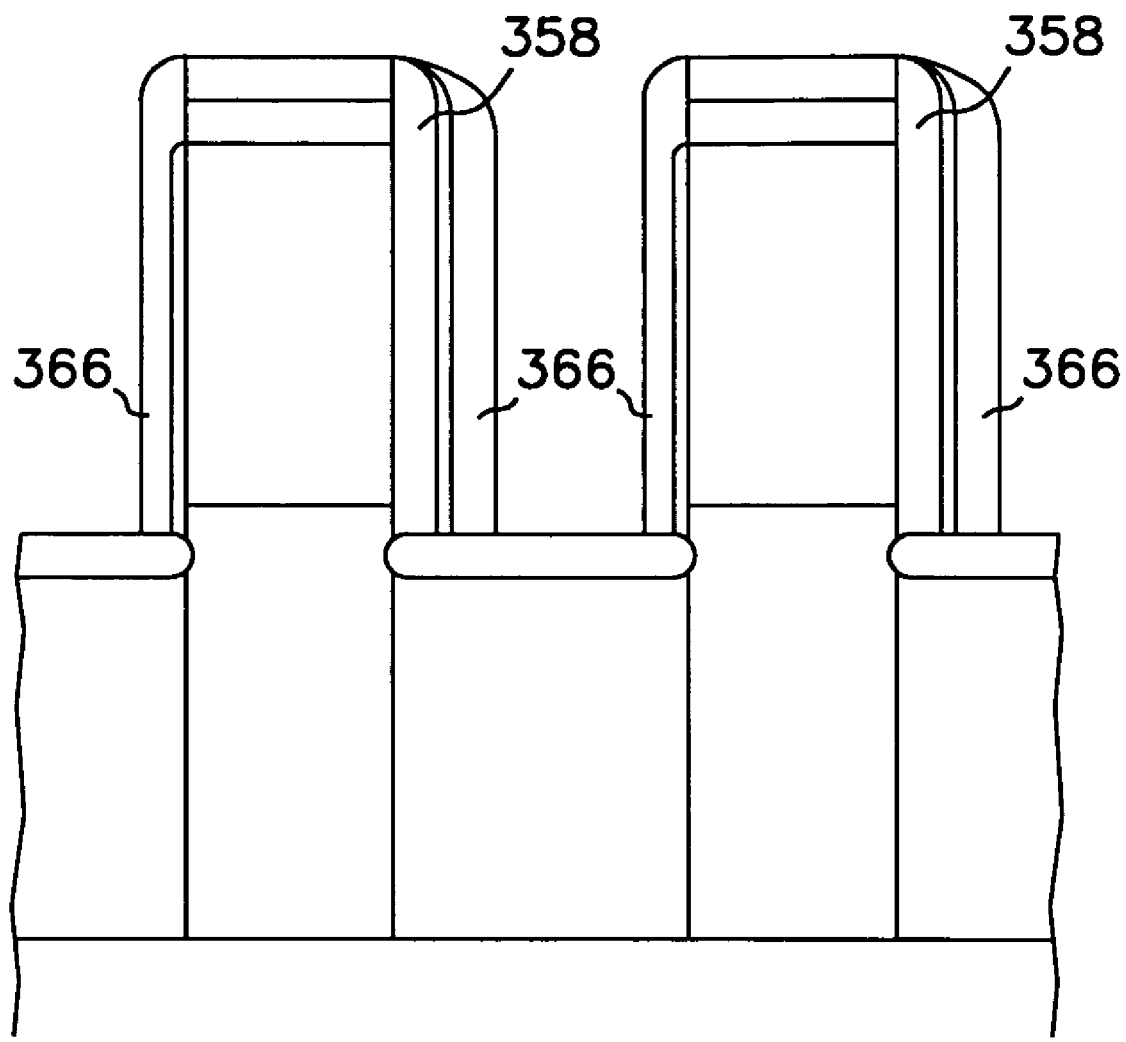
Figure 5M:
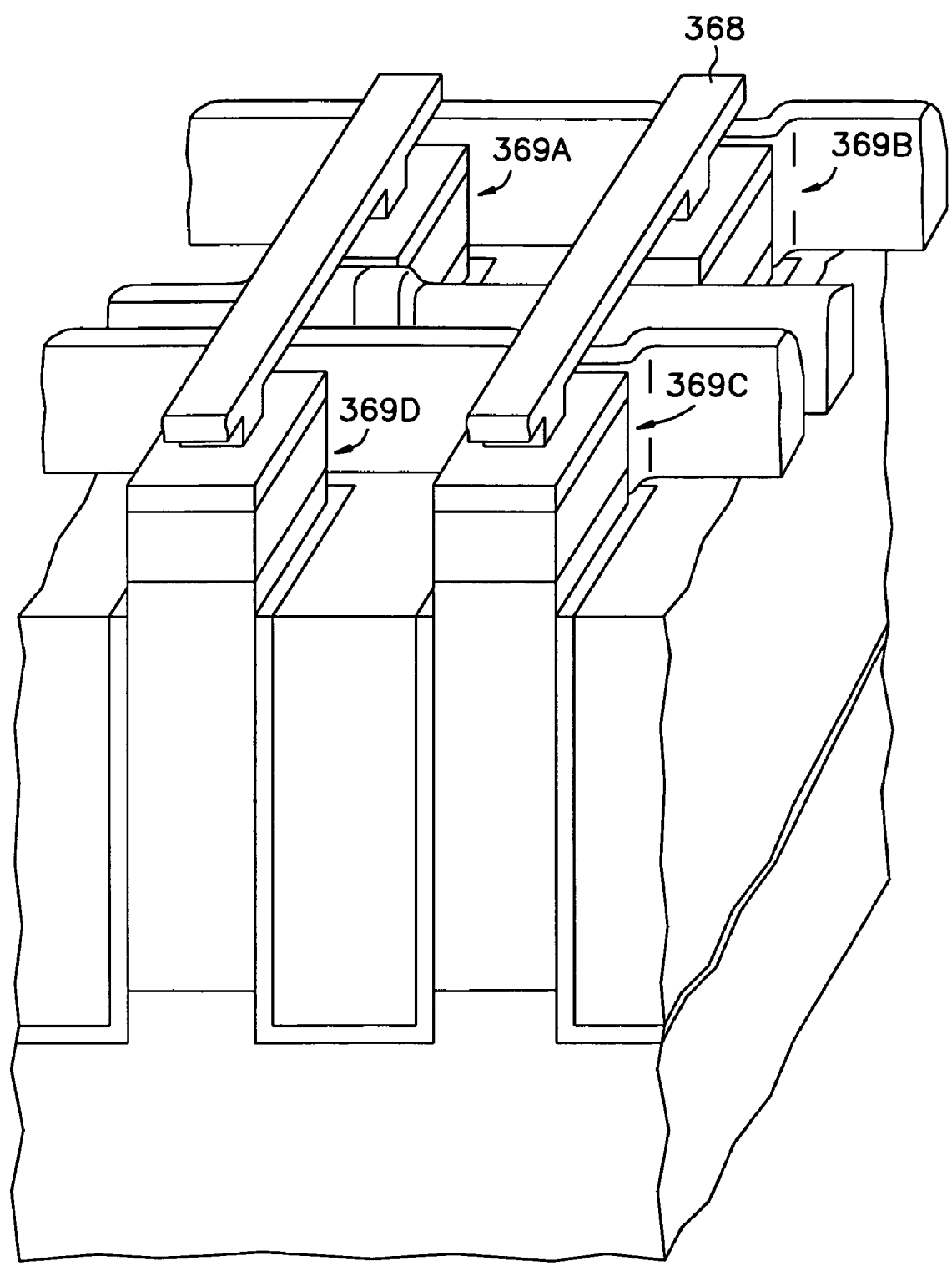

Referring to FIG. 5L, word line conductors 366 are deposited by, for example, chemical vapor deposition of n+ poly-silicon or other refractory metal to a thickness of approximately 50 nanometers. Conductors 366 are directionally and selectively etched to leave on sidewalls 352 of pillars 334A through 334D and on exposed surfaces of intrinsic poly-silicon layer 358.

Next, a brief oxide etch is used to expose the top surface of intrinsic poly-silicon layer 358. Layer 358 is then selectively etched to remove the remaining intrinsic poly-silicon using an etchant such as KOH and alcohol, ethylene and pyrocatechol or gallic acid (as described in U.S. Pat. No. 5,106,987 issued to W. D. Pricer). Next, an oxide layer is deposited by, for example, chemical vapor deposition to fill the space vacated by layer 358 and to fill in between word line conductors 366. Additionally conventional process steps are used to add bit lines 368 so as to produce the structure shown in FIG. 5M including memory cells 369A through 369D.

CONCLUSION

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. For example, the semiconductor materials and dimensions specified in this application are given by way of example and not by way of limitation. Other appropriate material can be substituted without departing from the spirit and scope of the invention.

What is claimed is:

1. A method comprising:
   accessing a plurality of memory cells of a memory device, each of the memory cells including a capacitor, and a transistor formed vertically from a substrate of the memory device, the transistor including a first source/drain region, a body region, and a second source/drain region, the capacitor including a first capacitor plate integral with the second source/drain region, and a second capacitor plate formed in a trench, the trench surrounding at least a portion of the second source/drain region, the memory device including a metal contact for providing an ohmic contact for the second capacitor plate on a surface of the substrate; and
   transferring data between the memory cells and at least one bit line of the memory device.

2. The method of claim 1, wherein accessing the plurality of memory cells includes activating a number of word lines of the memory device, wherein the word lines include a word line pair formed in the trench.

3. The method of claim 2, wherein the bit line is formed above the trench.

4. The method of claim 3, wherein the word lines are orthogonal to the bit line.

5. The method of claim 1, wherein transferring data includes transferring a charge between the first capacitor plate of one of the memory cells and the bit line.

6. The method of claim 1, wherein transferring data further includes transferring data between the bit line of the memory device and a processor coupled to the memory device.

7. A method comprising:
   activating a number of word lines of a memory device to select a number of activated memory cells among a plurality of memory cells of the memory device; and
   transferring data between the activated memory cells and a bit line of the memory device, each of the memory cells including a capacitor, and a transistor formed vertically from a substrate of the memory device, the transistor including a first source/drain region, a body region, and a second source/drain region, the capacitor including a first capacitor plate integral with the second source/drain region, and a second capacitor plate separate from the first capacitor plate, the memory device including a plurality of trenches dividing the memory cells into rows and columns and a metal contact for providing an ohmic contact for the second capacitor plate on a surface of the substrate, and the second capacitor plate of the capacitor of each of the memory cells being formed in the trenches.

8. The method of claim 7, wherein activating the number of word lines includes:
   activating a first portion of the activated memory cells of a first row using a first word line of the number of word lines; and
   activating a second portion of the activated memory cells of a second row using a second word line of the number of word lines, wherein the first and second word lines are located in one of the trenches between the first and second rows.

9. The method of claim 7, wherein transferring data includes transferring a charge from the first capacitor plate of one of the activated memory cells to the bit line.

10. The method of claim 7, wherein transferring data includes transferring a charge from the bit line to the first capacitor plate of one of the activated memory cells.

11. The method of claim 10, wherein the bit line is formed above the trenches.

12. The method of claim 11, wherein the word lines are orthogonal to the bit line.

13. A method comprising:
activating a number of word lines of a memory device to select a number of activated memory cells among a plurality of memory cells of the memory device; and
transferring data between the activated memory cells and a bit line of the memory device, the memory cells including a number of trench capacitors, and a number of access transistors separated by trenches, each of the access transistors being formed in a pillar of semiconductor material, the pillar extending outwardly from a substrate of the memory device, each of the access transistors including a first source/drain region, a body region, and a second source/drain region formed vertically with the first source/drain region and the body region, the memory device including a plurality of bridges, each of the bridges including an insulation material, each of the bridges extending through a column of the access transistors, each of the trench capacitors including a first capacitor plate integral with the second source/drain region of one of the access transistors, and a second capacitor plate formed in the trenches, the memory device including a metal contact for providing an ohmic contact for the second capacitor plate on a surface of the substrate.

14. The method of claim 13, wherein activating the number of word lines includes:
activating a first portion of the activated memory cells of a first row of the plurality of memory cells using a first word line of the number of word lines; and
activating a second portion of the activated memory cells of a second row of the plurality of memory cells using a second word line of the number of word lines, wherein the first and second word lines are located in a trench between the first and second rows.

15. The method of claim 14, wherein transferring data includes transferring a charge from the first capacitor plate of one of the activated memory cells to a bit line of the memory device.

16. The method of claim 15, wherein transferring data includes transferring a charge from the bit line to the first capacitor plate of one of the activated memory cells.

17. The method of claim 16, wherein the bit line is formed above the trenches.

18. The method of claim 17, wherein the word lines are orthogonal to the bit line.

19. A method comprising:
activating a word line of a plurality of word lines of a memory device based on an address information;
activating a bit line of a plurality of bit lines of the memory device based on the address information;
accessing at least one memory cell of a plurality of memory cells of the memory device, the memory cell being accessed is coupled to the word line and the bit line; and
transferring data between the memory cell being accessed and the bit line, wherein each of the memory cells including a capacitor, and a transistor formed vertically from a substrate of the memory device, the transistor including a first source/drain region, a body region, and a second source/drain region, the capacitor including a first capacitor plate integral with the second source/drain region, and a second capacitor plate formed in a trench, the trench surrounding at least a portion of the first source/drain region, the memory device including a metal contact for providing an ohmic contact for the second capacitor plate on a surface of the substrate.

20. The method of claim 19, wherein the word lines include at least one word line pair formed in the trench.

21. The method of claim 20, wherein the bit line is formed above the trenches.

22. The method of claim 19, wherein transferring data includes transferring a charge from the first capacitor plate of the memory cell being accessed to the bit line during a read operation.

23. The method of claim 22, wherein transferring data includes transferring a charge from the bit line to the first capacitor plate of the memory cell being accessed during a write operation.

24. A method comprising:
receiving an address information;
selectively activating a word line of a plurality of word lines of a memory device based on the address information;
selectively activating a bit line of a plurality of bit lines of the memory device based on the address information;
accessing at least one memory cell of a plurality of memory cells of the memory device, the memory cell being accessed is coupled to the word line and the bit line; and
transferring data between the memory cell being accessed and the bit line, wherein the plurality of memory cells including a number of trench capacitors, and a number of access transistors separated by trenches, each of the access transistors being formed in a pillar of semiconductor material, the pillar extending outwardly from a substrate of the memory device, each of the access transistors including a first source/drain region, a body region, and a second source/drain region formed vertically with the first source/drain region and the body region, the memory device including a plurality of bridges, each of the bridges including an insulation material, each of the bridges extending through a column of the access transistors, each of the trench capacitors including a first capacitor plate integral with the second source/drain region of one of the access transistors, and a second capacitor plate formed in the trenches, the memory device including a metal contact for providing an ohmic contact for the second capacitor plate on a surface of the substrate.

25. The method of claim 24, wherein the word lines include at least one word line pair formed in one of the trenches.

26. The method of claim 25, wherein the bit line is formed above the trenches.

27. The method of claim 24, wherein transferring data includes transferring a charge from the first capacitor plate of the memory cell being accessed to the bit line.

28. The method of claim 27, wherein transferring data includes transferring a charge from the bit line to the first capacitor plate of the memory cell being accessed.

29. A method comprising:
activating a number of word lines of a memory device to select a number of activated memory cells among a plurality of memory cells of the memory device, the memory cells including a number of trench capacitors, and a number of access transistors separated by trenches, each of the access transistors being formed in a pillar of semiconductor material, the pillar extending outwardly from a substrate of the memory device, each of the access transistors including a first source/drain region, a body region, and a second source/drain region formed vertically with the first source/drain region and the body region, the memory device including a plurality of bridges, each of the bridges including an insulation material, each of the bridges extending through a column of the access transistors, each of the trench capacitors including a first capacitor plate integral with the second source/drain region of one of the access transistors, and a second capacitor plate formed in the trenches, the memory device including a metal contact for providing an ohmic contact for the second capacitor plate on a surface of the substrate;

transferring data between the activated memory cells and an input/output circuit of the memory device; and transferring data between the input/output circuit and a processor coupled to the memory device.

30. The method of claim 29, wherein activating the number of word lines includes:

activating a first portion of the activated memory cells of a first row of the plurality of memory cells using a first word line of the number of word lines; and activating a second portion of the activated memory cells of a second row of the plurality of memory cells using a second word line of the number of word lines, wherein the first and second world lines are located in a trench between the first and second rows.

31. The method of claim 29 further comprising:

activating a bit line of the memory device, the bit line being coupled to the first source/drain region of the access transistor of one of the activated memory cells.

32. The method of claim 31, wherein the bit line is formed above the trenches.

33. The method of claim 32, wherein the word lines are orthogonal to the bit line.

34. The method of claim 29, wherein transferring data includes transferring a charge from the first capacitor plate of one of the activated memory cells to the bit line of the memory device.

35. The method of claim 34, wherein transferring data includes transferring a charge from the bit line to the first capacitor plate of one of the activated memory cells.

* * * * *

UNITED STATES PATENT AND TRADEMARK OFFICE
CERTIFICATE OF CORRECTION

PATENT NO. : 7,223,678 B2 Page 1 of 1
APPLICATION NO. : 11/214557
DATED : May 29, 2007
INVENTOR(S) : Noble et al.

It is certified that error appears in the above-identified patent and that said Letters Patent is hereby corrected as shown below:

Column 3, line 52 (Approx.), delete "fall" and insert -- full --, therefor.

Column 9, line 10, delete "51," and insert -- 5I, --, therefor.

Signed and Sealed this

Eleventh Day of September, 2007

JON W. DUDAS
*Director of the United States Patent and Trademark Office*